(12) United States Patent
Otsuka

(10) Patent No.: US 11,972,997 B2
(45) Date of Patent: Apr. 30, 2024

(54) SEMICONDUCTOR DEVICE

(71) Applicant: ROHM CO., LTD., Kyoto (JP)

(72) Inventor: Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 434 days.

(21) Appl. No.: 17/293,801

(22) PCT Filed: Nov. 14, 2019

(86) PCT No.: PCT/JP2019/044625
§ 371 (c)(1),
(2) Date: May 13, 2021

(87) PCT Pub. No.: WO2020/116116
PCT Pub. Date: Jun. 11, 2020

(65) Prior Publication Data
US 2022/0013427 A1 Jan. 13, 2022

(30) Foreign Application Priority Data
Dec. 3, 2018 (JP) .................. 2018-226408

(51) Int. Cl.
*H01L 23/36* (2006.01)
*H01L 23/31* (2006.01)
*H01L 23/532* (2006.01)

(52) U.S. Cl.
CPC .......... *H01L 23/36* (2013.01); *H01L 23/3142* (2013.01); *H01L 23/53276* (2013.01)

(58) Field of Classification Search
CPC ............... H01L 23/36; H01L 23/3142; H01L 23/53276; H01L 23/4334; H01L 23/49531;
(Continued)

(56) References Cited

U.S. PATENT DOCUMENTS

2012/0152510 A1* 6/2012 Noda .................. B23K 1/0016
228/208
2019/0148304 A1* 5/2019 Gavagnin ........... H01L 21/4853
257/773

FOREIGN PATENT DOCUMENTS

JP 2009-158787 A 7/2009
JP 2011-258755 A 12/2011
(Continued)

OTHER PUBLICATIONS

Machine translation of JP2018174252 (Year: 2018).*
(Continued)

*Primary Examiner* — Yasser A Abdelaziez
(74) *Attorney, Agent, or Firm* — HSML P.C.

(57) ABSTRACT

Semiconductor device (A10) includes conductive substrate (20) and semiconductor element (40). The conductive substrate (20) has obverse surface (20A) facing in thickness direction (z) and reverse surface (20B) facing opposite from the obverse surface (20A). The semiconductor element (40) is electrically bonded to the obverse surface (20A). The conductive substrate (20) includes first base layer (211), second base layer (212) and metal layer (22). The first base layer (211) and second base layer (212) are made of graphite composed of stacked graphenes. The metal layer (22) is between the first base layer (211) and the second base layer (212). The graphenes of the first base layer (211) are stacked in first stacking direction perpendicular to the thickness direction (z). The graphenes of the second base layer (212) are stacked in second stacking direction perpendicular to the thickness direction (z) and crossing the first stacking direction.

14 Claims, 17 Drawing Sheets

(58) Field of Classification Search
CPC ........... H01L 23/49877; H01L 23/3735; H01L 2224/06181; H01L 2224/32225; H01L 23/49811
See application file for complete search history.

(56) References Cited

FOREIGN PATENT DOCUMENTS

| | | |
|---|---|---|
| JP | 2012-142547 A | 7/2012 |
| JP | 2012-222160 A | 11/2012 |
| JP | 2016-149431 A | 8/2016 |
| JP | 2016-149450 A | 8/2016 |
| JP | 2018-174252 A | 11/2018 |
| JP | 2018174252 | * 11/2018 |

OTHER PUBLICATIONS

Office Action received in the corresponding Chinese Patent application, dated May 30, 2023, and machine translation (12 pages).
Office Action received in the corresponding Japanese Patent application, dated Oct. 4, 2022, and machine translation (8 pages).
International Search Report issued in PCT/JP2019/044625, dated Feb. 10, 2020 (2 pages).

* cited by examiner

SEMICONDUCTOR DEVICE

TECHNICAL FIELD

The present disclosure relates to semiconductor devices incorporating semiconductor elements.

BACKGROUND ART

Conventionally, semiconductor devices incorporating semiconductor elements, such as MOSFETs and IGBTs, are widely known. Patent Document 1 discloses a semiconductor device that includes such a semiconductor element. The semiconductor device has a pattern of metal foil deposited on a support substrate (an insulating substrate in Patent Document 1). The semiconductor element is electrically bonded to the metal pattern.

During operation of the semiconductor device disclosed in Patent Document 1, heat is generated by the semiconductor element to elevate the temperature of the metal pattern. Patterns of metal foil are relatively thin and therefore have relatively high thermal resistance per unit length in a direction perpendicular to the thickness direction. Consequently, conduction of heat in the metal pattern is limited in a direction perpendicular to the thickness direction, and the temperature of the metal pattern decreases only gradually. As a result, the temperature of the metal pattern tends to remain high at locations near the semiconductor element.

PRIOR ART DOCUMENT

Patent Document

Patent Document 1: JP-A-2009-158787

SUMMARY OF THE INVENTION

Problem to be Solved by the Invention

The present disclosure has been conceived in view of the circumstances described above, and its main objective is to provide a semiconductor device with improved thermal dissipation.

Means to Solve the Problem

The present disclosure provides a semiconductor device including: a conductive substrate having an obverse surface facing one side in a thickness direction and a reverse surface facing an opposite side from the obverse surface; and a semiconductor element electrically bonded to the obverse surface. The conductive substrate includes a first base layer and a second base layer each of which is made of graphite composed of stacked graphenes, and a metal layer disposed between the first base layer and the second base layer. The graphenes of the first base layer are stacked in a first stacking direction perpendicular to the thickness direction. The graphenes of the second base layer are stacked in a second stacking direction perpendicular to the thickness direction and intersecting the first stacking direction.

Other features and advantages of the present disclosure will be more apparent from the detailed description given below with reference to the accompanying drawings.

MODE FOR CARRYING OUT THE INVENTION

Figure 1:
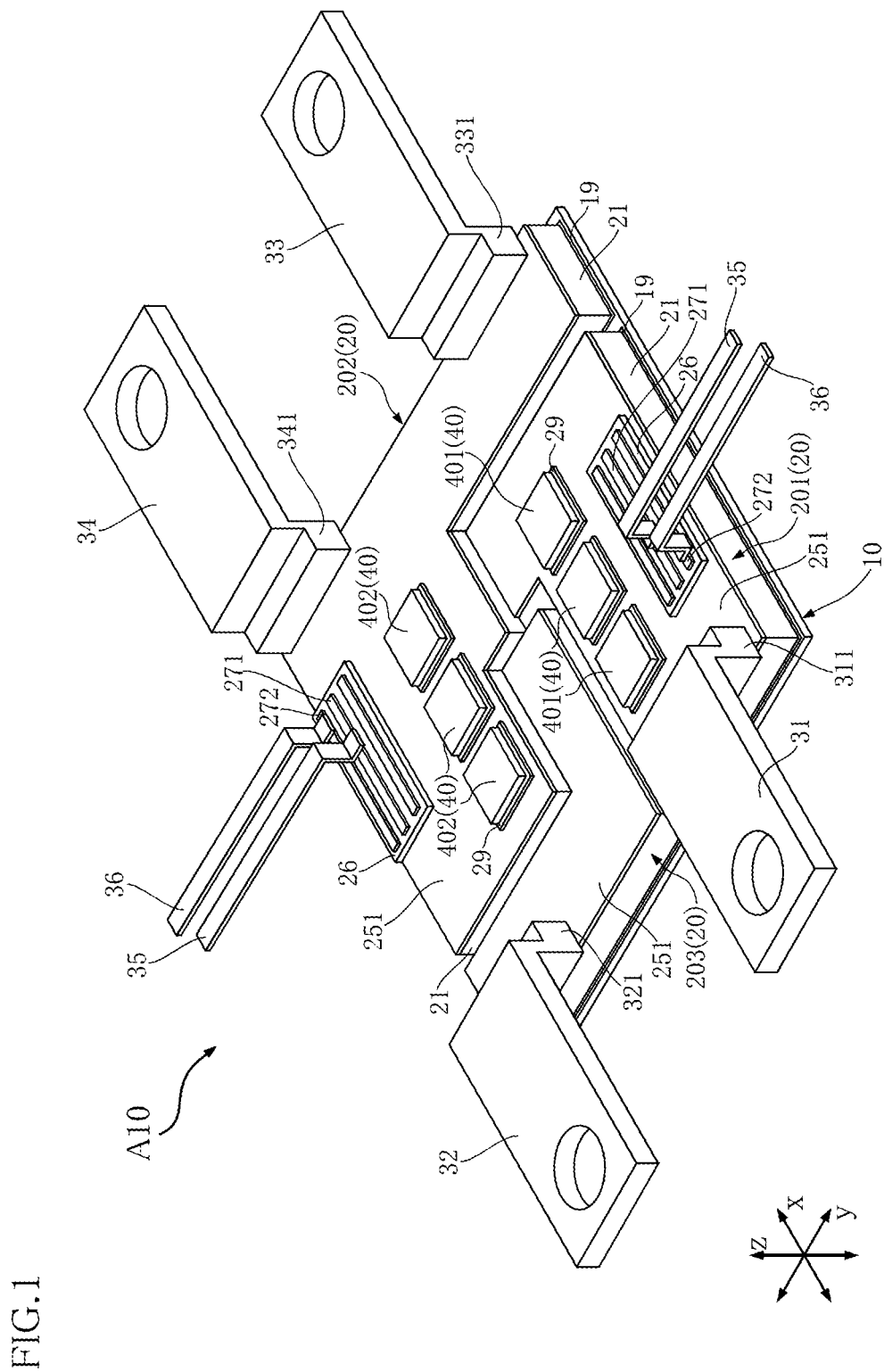
FIG. 1 is a perspective view of a semiconductor device according to a first embodiment of the present disclosure.
Figure 2:
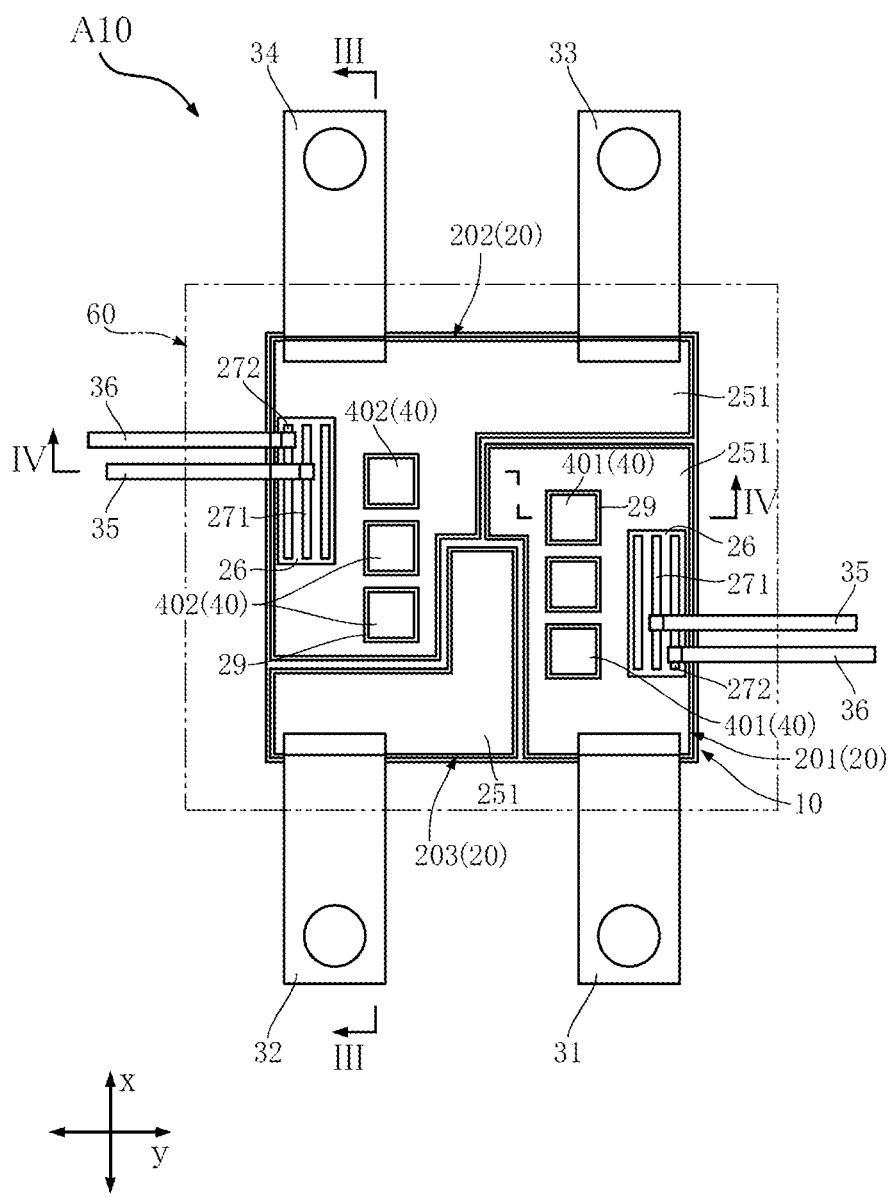
FIG. 2 is a plan view of the semiconductor device shown in FIG. 1.
Figure 3:
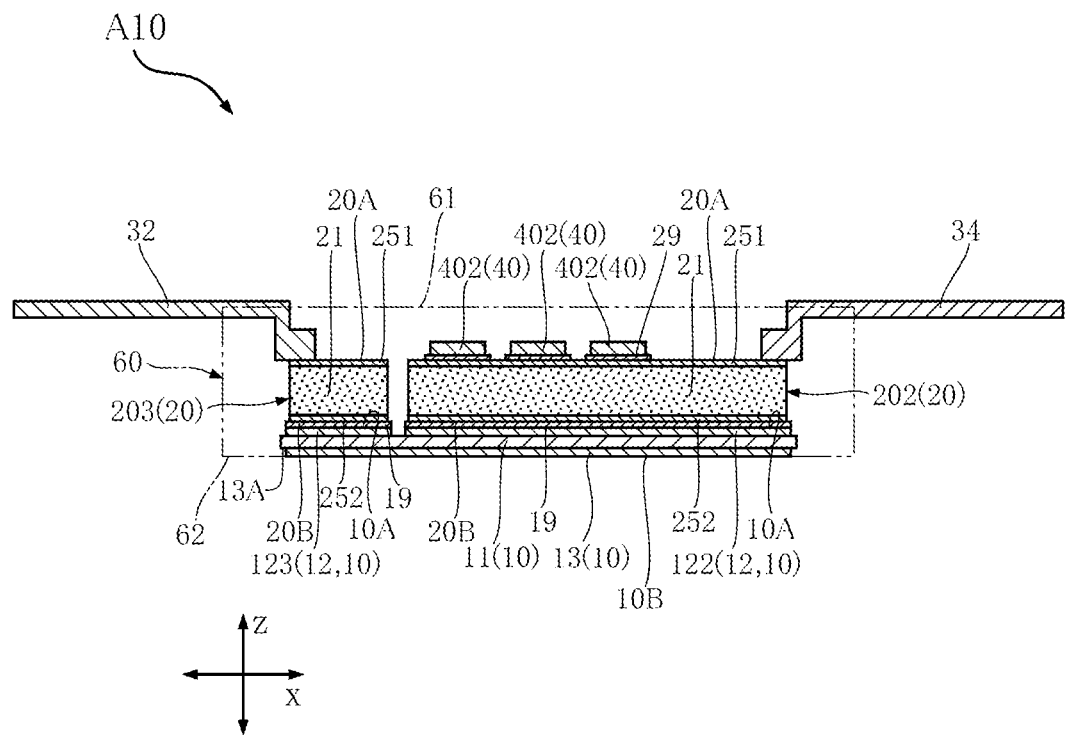
FIG. 3 is a sectional view taken along line III-III of FIG. 2.
Figure 4:
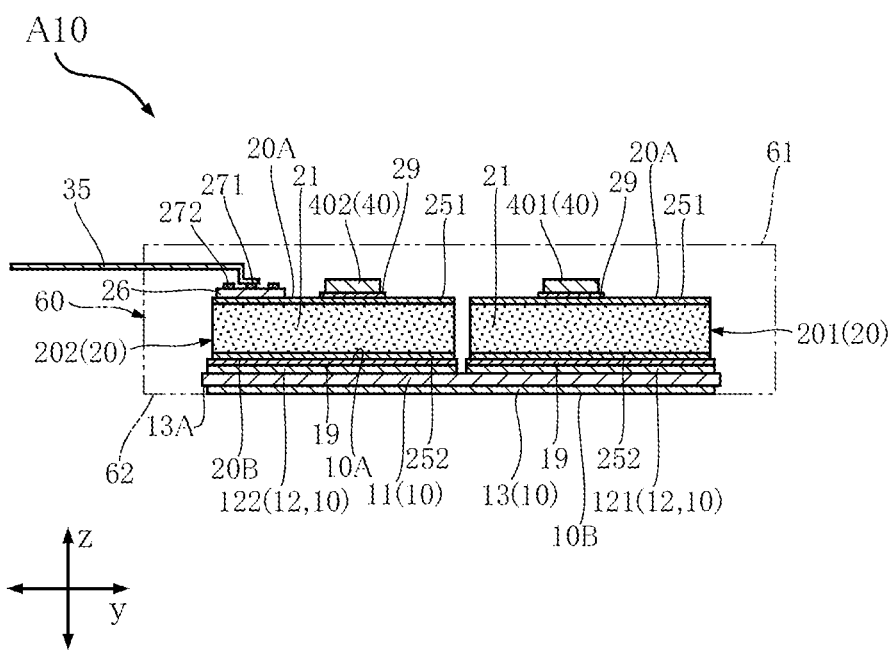
FIG. 4 is a sectional view taken along line IV-IV of FIG. 2.

With reference to FIGS. 1 to 10, a semiconductor device A10 according to a first embodiment of the present disclosure will be described. The semiconductor device A10 includes a support substrate 10, a bonding layer 19, a conductive substrate 20, a bonding layer 29, a first input terminal 31, a second input terminal 32, a first output terminal 33, a second output terminal 34, a plurality of semiconductor elements 40 and a sealing resin 60. Additionally, the semiconductor device A10 includes a pair of insulating layers 26, a pair of gate wiring layers 271, a pair of sensor wiring layers 272, a pair of gate terminals 35 and a pair of sensor terminals 36. The semiconductor device A10 shown in the figures is a power converter (power module) that includes MOSFETs as the semiconductor elements 40. The semiconductor device A10 can be used, for instance, as a driving source for a motor, an inverter for a various electrical products, and a DC/DC converter. Note that FIG. 1 omits the sealing resin 60. For convenience, FIGS. 2 to 5 show the sealing resin 60 as transparent. FIGS. 2 to 4 show the sealing resin 60 in phantom (dash-double dot lines).

In the description of the semiconductor device A10, the thickness direction of the conductive substrate 20 and the support substrate 10 is designated as the "thickness direction z". A direction perpendicular to the thickness direction z is designated as the "first direction x". The direction perpendicular to both of the thickness direction z and the first direction x is designated as the "second direction y". As shown in FIGS. 1 and 2, the semiconductor device A10 has a rectangular shape as viewed in the thickness direction z. The first direction x and the second direction y correspond to the directions in which the edges of the rectangular semiconductor device A10 extend. For convenience in the description of the semiconductor device A10, the side in the first direction x at which the first input terminal 31 and the second input terminal 32 are located is designated as the "first side in the first direction x", and the side in the first direction x at which the first output terminal 33 and the second output terminal 34 are located is designated as the "second side in the first direction x".

As shown in FIGS. 1 to 4, the support substrate 10 supports the conductive substrate 20. In the example of the semiconductor device A10, the support substrate 10 has a substantially square shape as viewed in the thickness direction z. The support substrate 10 has a supporting surface 10A and a bottom surface 10B facing opposite from each other in the thickness direction z. The supporting surface 10A faces the conductive substrate 20. As shown in FIGS. 3 and 4, the bottom surface 10B is exposed from the sealing resin 60. The semiconductor device A10 may be mounted on a heatsink, with the bottom surface 10B facing the heatsink. The support substrate 10 of the semiconductor device A10 includes a first supporting plate 11, a second supporting plate 12 and a bottom plate 13.

As shown in FIGS. 3 and 4, the first supporting plate 11 is disposed between the second supporting plate 12 and the bottom plate 13 in the thickness direction z. The first supporting plate 11 is electrically insulating. The first supporting plate 11 is made of a ceramic material having high thermally conductivity. Examples of such a ceramic material include aluminium nitride (AlN).

The second supporting plate 12 is stacked on the first supporting plate 11. The second supporting plate 12 has the supporting surface 10A. In the semiconductor device A10, the conductive substrate 20 is bonded to the second supporting plate 12. The second supporting plate 12 is made of metal, such as metal foil of copper (Cu) or a copper alloy. Hence, the second supporting plate 12 is electrically conductive. In the example of the semiconductor device A10, the second supporting plate 12 has a first region 121, a second region 122 and a third region 123. These three regions are spaced apart from each other.

The bottom plate 13 is stacked on the first supporting plate 11 at the opposite side from the second supporting plate 12. The bottom plate 13 has the bottom surface 10B. Similarly to the second supporting plate 12, the bottom plate 13 is made of metal, such as metal foil of copper (Cu) or a copper alloy. Hence, the bottom plate 13 is electrically conductive. As can be seen from FIGS. 3 and 4, the bottom plate 13 has a smaller area than the first supporting plate 11 as viewed in the thickness direction z. Hence, the outline of the first supporting plate 11 locates outside the outline of bottom plate 13. That is, the support substrate 10 has a recessed portion 13A around the bottom plate 13 as viewed in the thickness direction z. The recessed portion 13A is covered by the sealing resin 60.

The support substrate 10 of the semiconductor device A10 can be formed from a direct bonded copper (DBC) substrate to facilitate the fabrication. A DBC substrate includes a ceramic plate and a pair of copper foil layers bonded to the both sides of the ceramic plate in the thickness direction z. The ceramic plate will be formed into the first supporting plate 11. The pair of copper foil layers will be formed into the second supporting plate 12 and the bottom plate 13, by etching unnecessary portions away.

As shown in FIGS. 3 and 4, the bonding layer 19 covers at least a portion of the supporting surface 10A of the support substrate 10. In the semiconductor device A10, the bonding layer 19 covers the supporting surface 10A included in each of the first region 121, the second region 122 and the third region 123 of the second supporting plate 12.

As shown in FIGS. 3 and 4, the conductive substrate 20 is bonded by the bonding layer 19 to the second supporting plate 12 of the support substrate 10. In the semiconductor device A10, the conductive substrate 20 form conduction paths connecting the semiconductor elements 40 to external components of the semiconductor device A10 through the first input terminal 31, the second input terminal 32, the first output terminal 33 and the second output terminal 34. The conductive substrate 20 has an obverse surface 20A and a reverse surface 20B facing opposite from each other in the thickness direction z. The obverse surface 20A faces the same side as the supporting surface 10A of the support substrate 10 in the thickness direction z. The reverse surface 20B faces the supporting surface 10A of the support substrate 10.

As shown in FIGS. 2 to 4, the conductive substrate 20 includes a first conductive segment 201, a second conductive segment 202 and a third conductive segment 203. The first conductive segment 201 is bonded to the first region 121 of the second supporting plate 12. The second conductive segment 202 is bonded to the second region 122 of the second supporting plate 12. The third conductive segment 203 is bonded to the third region 123 of the second supporting plate 12. That is, the first conductive segment 201, the second conductive segment 202 and the third conductive segment 203 are spaced apart from each other.

Figure 5:
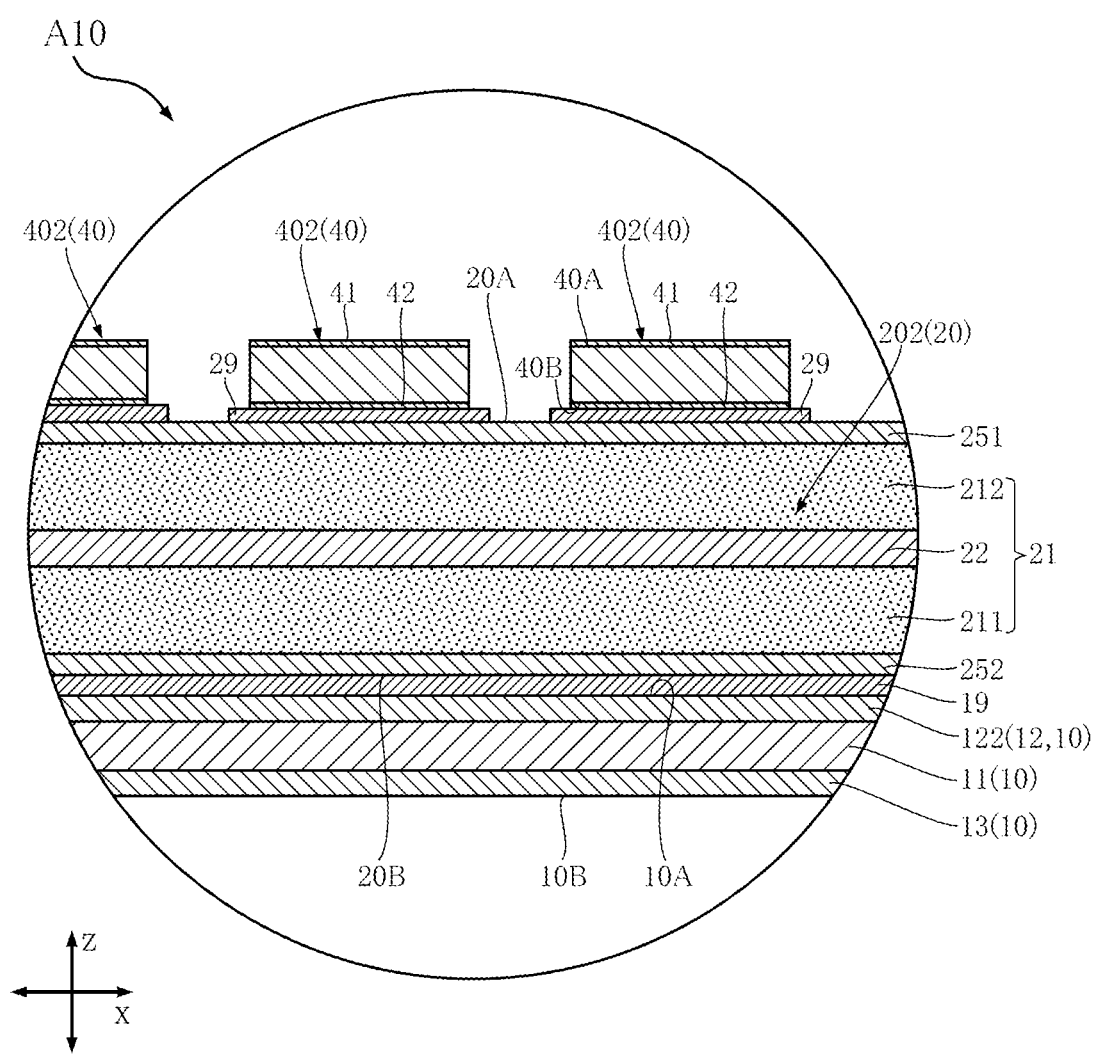
FIG. 5 is an enlarged view showing a part of FIG. 3.

In the semiconductor device A10, the conductive substrate 20 includes a base portion 21, a first wiring layer 251 and a second wiring layer 252. As shown in FIG. 5, the base portion 21 includes a first base layer 211, a second base layer 212 and a metal layer 22. The first base layer 211 and the second base layer 212 make up the majority of the conductive substrate 20 in volume. The first base layer 211 and the second base layer 212 are composed of single-crystal graphite. Graphite is a number of sheets of graphene stacked together. A sheet of graphene ("a graphene") is composed of carbon atoms bonded to form hexagonal lattices.

Graphite exhibits anisotropic thermal conductivity. The thermal conductivity of graphite is relatively high in the in-plane direction of graphene. The thermal conductivity in the in-plane direction is about 1500 W/(m·K). In the stacking direction of graphene, the thermal conductivity of graphite is relatively low. The thermal conductivity in the stacking direction is about 5 W/(m·K).

Figure 6:
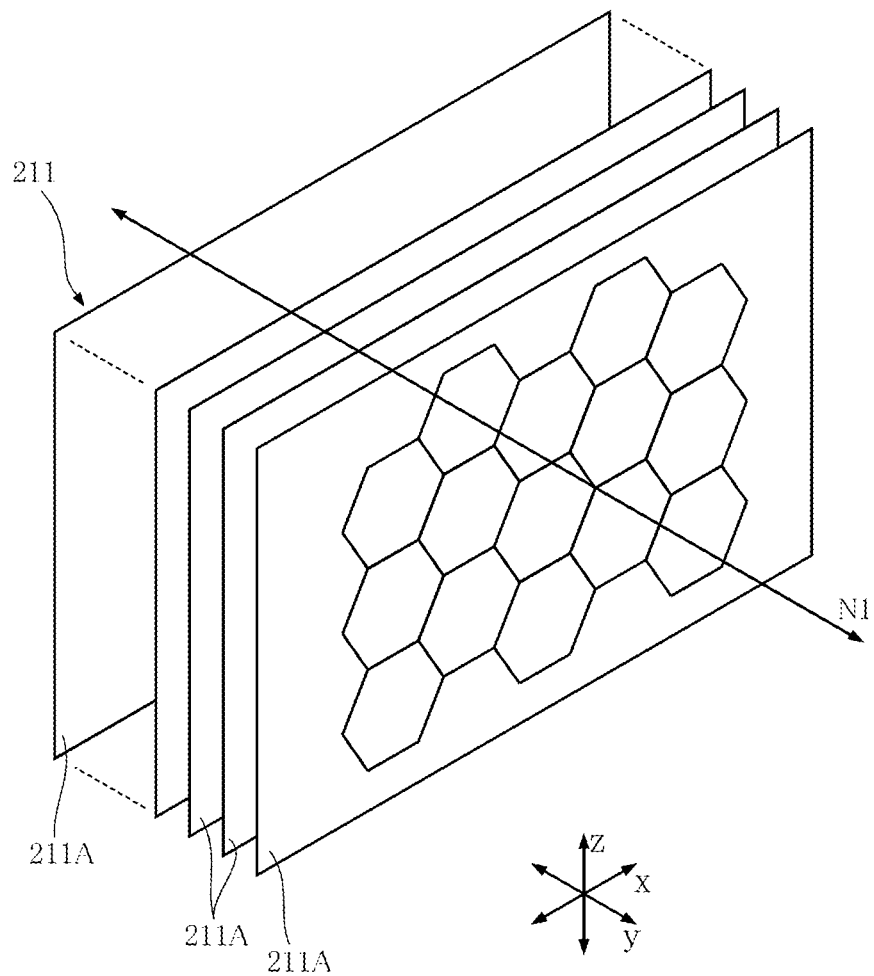
FIG. 6 is a schematic representation of stacked graphene sheets of graphite forming a first base layer of a conductive substrate.
Figure 7:
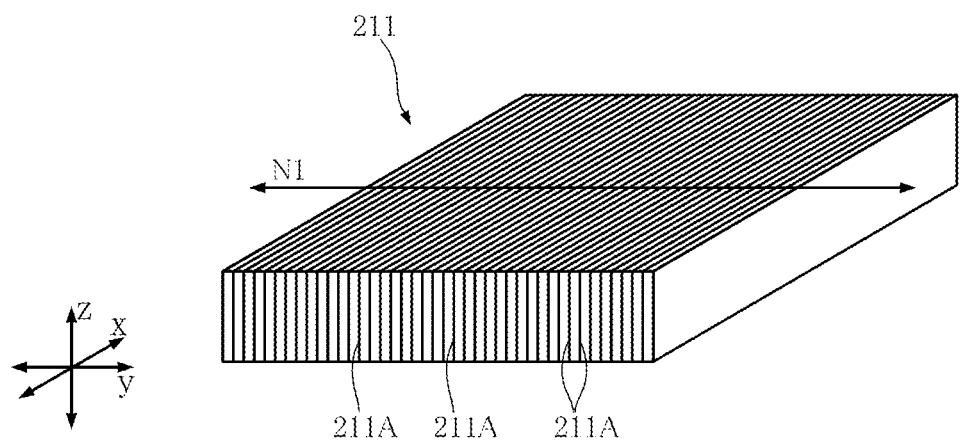
FIG. 7 is a schematic view of graphite forming the first base layer.

As shown in FIGS. 6 and 7, the first base layer 211 has the graphene sheets 211A stacked in a direction (first stacking direction N1) that is perpendicular to the thickness direction z and parallel to the second direction y. That is, the in-plane direction of the graphene sheets 211A forming the first base layer 211 extends along a plane defined by the first direction x and the thickness direction z. The first base layer 211 exhibits high thermal conductivity and thus good heat dissipation in the in-plane direction of graphene sheets 211A. The first base layer 211 of this configuration is defined to have the "xz orientation", which is termed to indicate the highly heat conductive, in-plane direction of the graphene sheets 211A.

Figure 8:
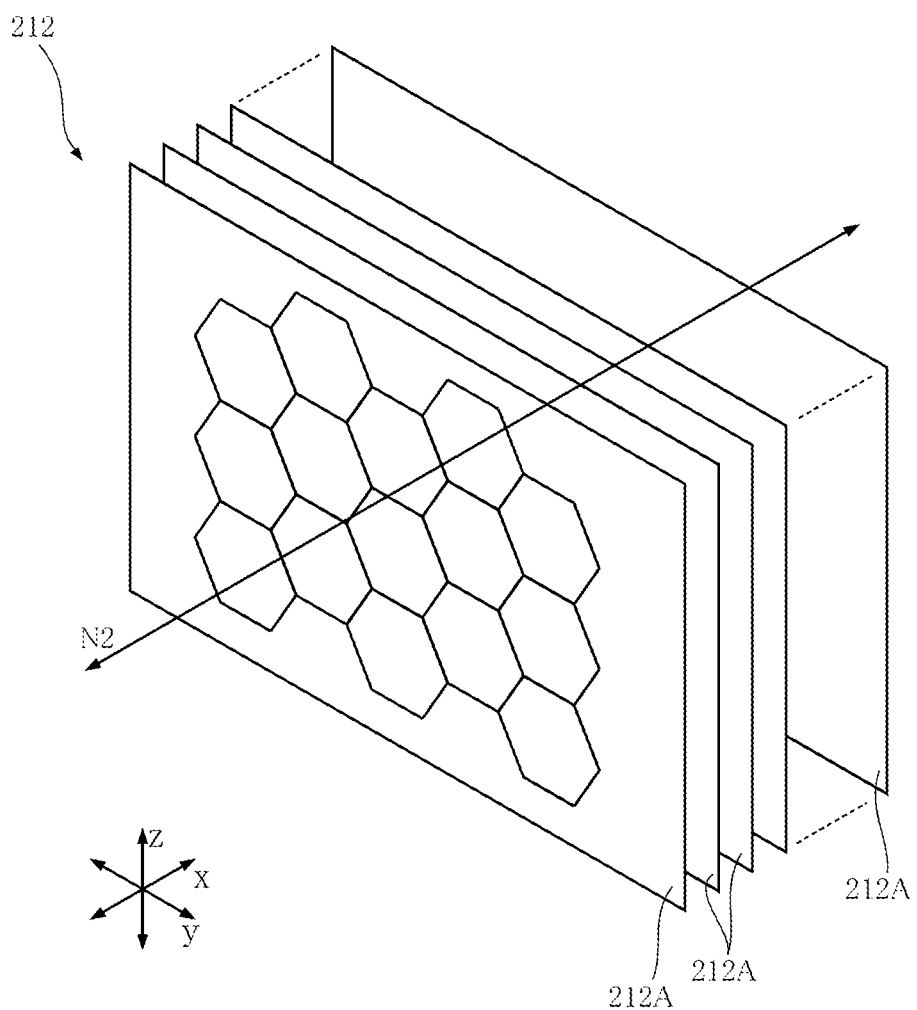
FIG. 8 is a schematic representation of stacked graphene sheets of graphite forming a second base layer of a conductive substrate.
Figure 9:
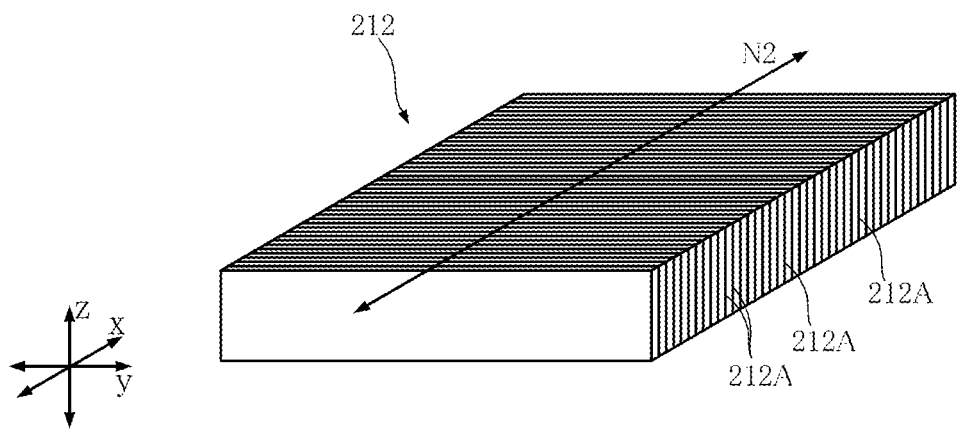
FIG. 9 is a schematic view of graphite forming the second base layer.
Figure 10:
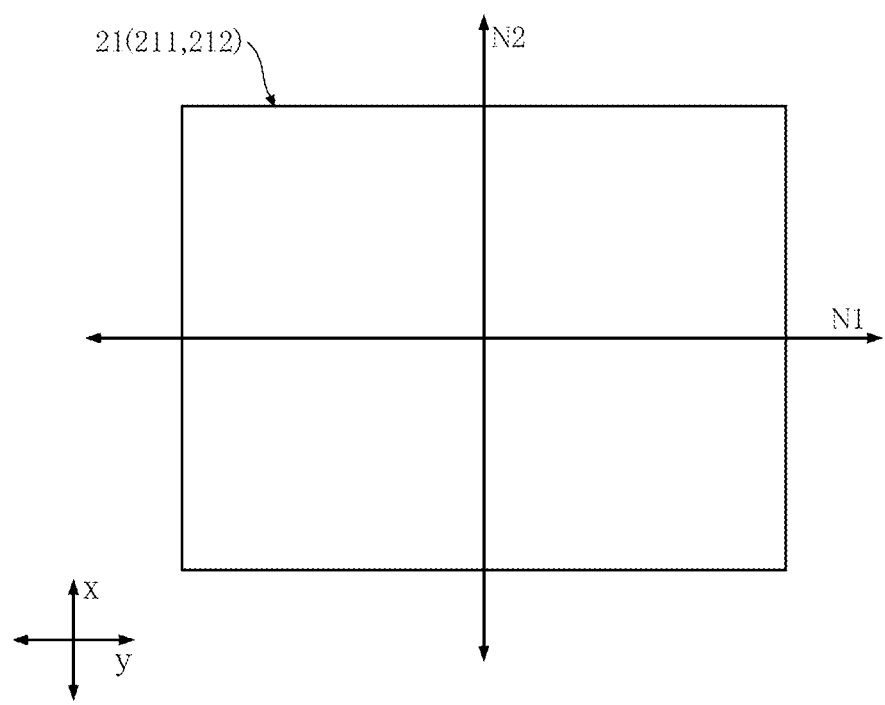
FIG. 10 is a view illustrating the relation between a first stacking direction and a second stacking direction as viewed in a thickness direction of the conductive substrate.

As shown in FIGS. 8 and 9, the second base layer 212 has the graphene sheets 212A stacked in a direction (second stacking direction N2) that is perpendicular to the thickness direction z. The stacking direction of the graphene sheets 212A (the second stacking direction N2) intersects the stacking direction of the graphene sheets 211A (the first stacking direction N1) of the first base layer 211. In the present embodiment, the stacking direction of the graphene sheets 212A (the second stacking direction N2) is parallel to the first direction x. That is, the stacking direction of the graphene sheets 212A (the second stacking direction N2) is perpendicular to the thickness direction z and also to the stacking direction of the graphene sheets 211A (the first stacking direction N1). Therefore, as shown in FIG. 10, the first stacking direction N1 and the second stacking direction N2 form a right angle as viewed in the thickness direction z. The in-plane direction of the graphene sheets 212A forming the second base layer 212 extends along a plane defined by the second direction y and the thickness direction z. The second base layer 212 exhibits high thermal conductivity and thus good heat dissipation in the in-plane direction of graphene sheets 212A. The second base layer 212 of this configuration is defined to have the "yz orientation", which is termed to indicate the highly heat conductive, in-plane direction of the graphene sheets 212A.

Figure 11:
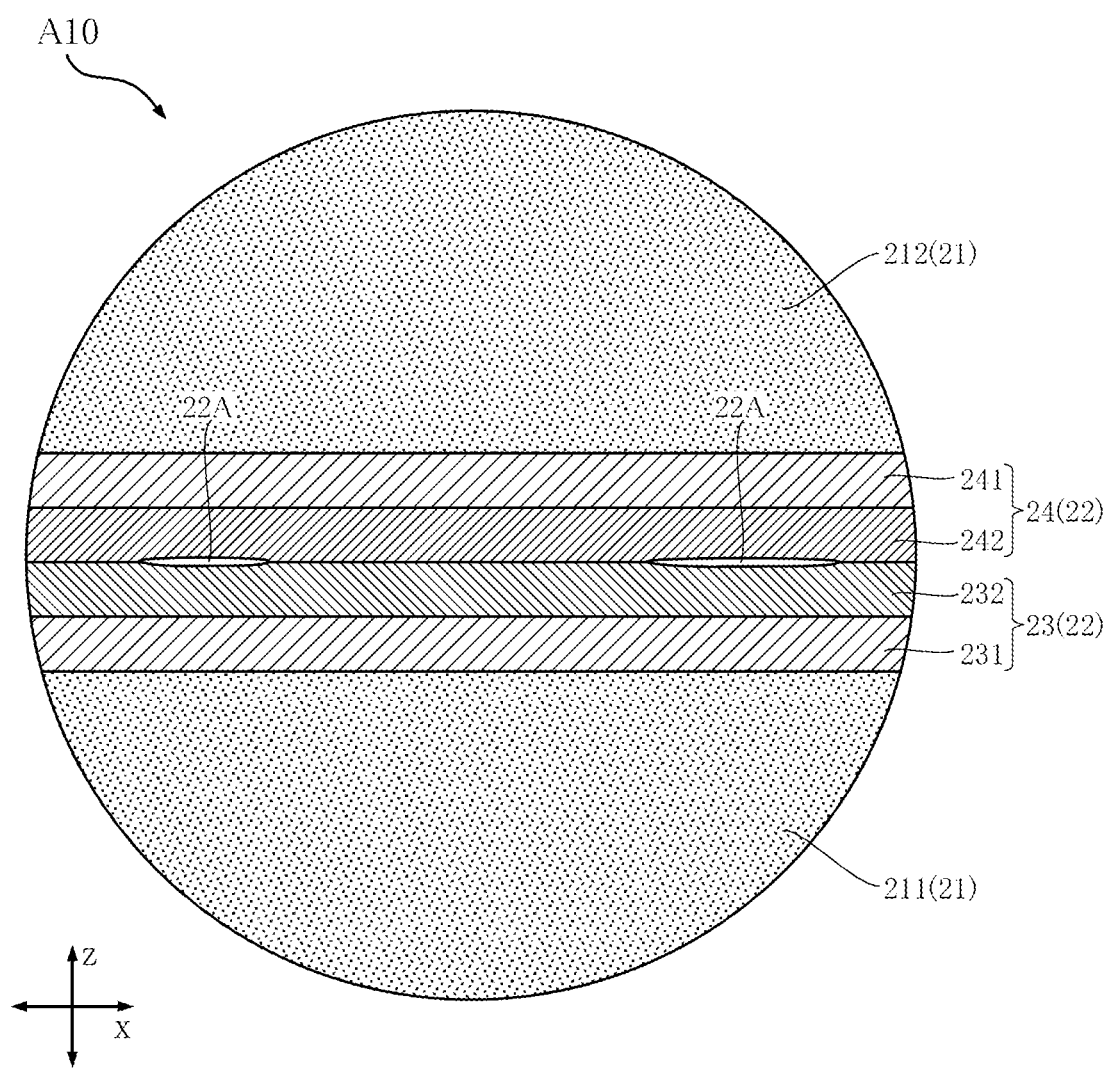
FIG. 11 is an enlarged view showing a part of FIG. 5.

The metal layer 22 is disposed between the first base layer 211 and the second base layer 212 to bond the first base layer 211 and the second base layer 212 to each other. As shown in FIG. 11, the metal layer 22 of the semiconductor device A10 includes a first metal part 23 and a second metal part 24.

The first metal part 23 is formed on the first base layer 211. The first metal part 23 includes a first layer 231 and a second layer 232. The first layer 231 covers the first base layer 211. The first layer 231 is made of copper or a copper alloy, for example. The first layer 231 has a Young's modulus of 129.8 GPa (provided that the first layer 231 is made of copper). The second layer 232 is stacked on the first layer 231. The second layer 232 is made of a material containing silver (Ag), for example. The second layer 232 has a Young's modulus of 82.7 GPa (provided that the second layer 232 is made of silver). The assembled first base layer 211 and first metal part 23 may be formed by attaching the first layer 231 to the first base layer 211 to prepare a plate member, and then depositing the second layer 232 on the plate member by plating.

The second metal part 24 is formed on the second base layer 212. The second metal part 24 includes a first layer 241 and a second layer 242. The first layer 241 covers the second base layer 212. Similarly to the first layer 231 of the first metal part 23, the first layer 241 is made of copper or a copper alloy. The second layer 242 is stacked on the first layer 241. Similarly to the second layer 232 of the first metal part 23, the second layer 242 is made of a material containing silver. The second base layer 212 and the second metal part 24 may be formed in a similar manner to the first base layer 211 and the first metal part 23 described above. That is, the first layer 241 is attached to the second base layer 212 to prepare a plate member, and then the second layer 242 is deposited on the plate member by plating.

Next, the process of bonding the first base layer 211 and the second base layer 212 is described.

First, the first metal part 23 having been formed on the first base layer 211 is placed in contact with the second metal part 24 formed on the second base layer 212. In this state, the second layer 232 of the first metal part 23 contacts the second layer 242 of the second metal part 24.

Subsequently, the second layer 232 of the first metal part 23 and the second layer 242 of the second metal part 24 are joined together by solid-state diffusion bonding. The diffusion bonding of the second layers 232 and 242 is conducted under high temperature and pressure. Although the solid-state diffusion bonding is intended to be carried out in atmosphere, it may be done in vacuum.

As shown in FIG. 11, voids 22A are formed between the second layer 232 of the first metal part 23 and the second layer 242 of the second metal part 24. The voids 22A are formed when the first metal part 23 (the second layer 232) and the second metal part 24 (the second layer 242) are joined together by solid-state diffusion bonding.

As shown in FIG. 5, the first wiring layer 251 is stacked on the second base layer 212 and includes the obverse surface 20A. The second wiring layer 252 is stacked on the first base layer 211 and includes the reverse surface 20B. That is, the base portion 21 (the first base layer 211, the second base layer 212 and the metal layer 22) is located between the first wiring layer 251 and the second wiring layer 252. The materials of the first wiring layer 251 and the second wiring layer 252 may be copper or a copper alloy and may contain silver. The first wiring layer 251 and the second wiring layer 252 have substantially the same configuration as the first metal part 23 and the second metal part 24 described above.

In one example, the layers of the conductive substrate 20 have the following thicknesses. The first base layer 211 and the second base layer 212 each have a thickness of about 0.5 to 1.0 mm. With reference to the first metal part 23 and the second metal part 24, the first layers 231 and 241 each have a thickness of about 2 to 3 μm or about 0.1 to 0.5 mm, and the second layers 232 and 242 each have a thickness of about 2 to 3 μm. The first wiring layer 251 and the second wiring layer 252 each have a thickness of about 4 to 6 μm or about 0.1 to 0.5 mm.

As shown in FIGS. 1, 2 and 4, the pair of insulating layers 26 are disposed on the respective obverse surfaces 20A of the first conductive segment 201 and the second conductive segment 202. The insulating layers 26 are spaced apart from each other in the second direction y. The insulating layers 26 have a band shape elongated in the first direction x. The insulating layers 26 are made of ceramic or glass epoxy resin, for example. The insulating layers 26 may be layers at least a surface of which is made of an insulating material of SiC, for example.

The pair of gate wiring layers 271 are disposed on the pair of insulating layers 26. The gate wiring layers 271 have a band shape elongated in the first direction x. The pair of sensor wiring layers 272 are disposed on the pair of insulating layers 26. The sensor wiring layers 272 have a band shape elongated in the first direction x. That is, one gate wiring layer 271 and one sensor wiring layer 272 are disposed to extend side by side on each insulating layer 26. The gate wiring layers 271 and the sensor wiring layers 272 may be layers of metal foil, such as copper or a copper alloy.

As shown in FIGS. 1 and 2, the first input terminal 31 and the second input terminal 32 are located on the first side in the first direction x. The first input terminal 31 and the second input terminal 32 are spaced apart from each other in the second direction y. Direct power (voltage) to be converted is input to the first input terminal 31 and the second input terminal 32. The first input terminal 31 is a positive terminal (P terminal). The second input terminal 32 is a negative terminal (N terminal). The first input terminal 31 and the second input terminal 32 are formed with metal plates. The metal plates are made of copper or a copper alloy.

The first input terminal 31 has a bent portion 311 forming a step at the end on the second side in the first direction x. The bent portion 311 is bonded to the obverse surface 20A of the first conductive segment 201 by soldering or ultrasonic bonding. In this manner, the first input terminal 31 is electrically connected to the first conductive segment 201. The second input terminal 32 has a bent portion 321 forming a step at the end on the second side in the first direction x. The bent portion 321 is bonded to the obverse surface 20A of the third conductive segment 203 by soldering or ultrasonic bonding. In this manner, the second input terminal 32 is electrically connected to the third conductive segment 203.

As shown in FIGS. 1 and 2, the first output terminal 33 and the second output terminal 34 are located on the second side in the first direction x. The first output terminal 33 and the second output terminal 34 are spaced apart from each other in the second direction y. The first output terminal 33 and the second output terminal 34 are where AC power (voltage) converted by the plurality of semiconductor elements 40 exits. The first output terminal 33 and the second output terminal 34 are made with metal plates. The metal plates are made of copper or a copper alloy. The first output terminal 33 has a bent portion 331 forming a step at the end on the first side in the first direction x, and the second output terminal 34 has a bent portion 341 forming a step at the end on the first side in the first direction x. The bent portions 331 and 341 are bonded to the obverse surface 20A of the second conductive segment 202 by soldering or ultrasonic bonding. In this manner, the first output terminal 33 and the second output terminal 34 are electrically connected to the second conductive segment 202.

The pair of gate terminals 35 are disposed on the pair of sensor wiring layers 271, and the pair of sensor terminals 36 are disposed on the pair of sensor wiring layers 272. Each of the gate terminals 35 and the sensor terminals 36 is made with a metal plate and extends in the second direction y. The metal plates are made of copper or a copper alloy.

Each of the gate terminals 35 and the sensor terminals 36 has an end that is bent to form a stepped portion. The end of each gate terminal 35 is connected to the corresponding gate wiring layer 271 by soldering or ultrasonic bonding. The end of each sensor terminal 36 is connected to the corresponding sensor wiring layer 272 by soldering or ultrasonic bonding.

The semiconductor elements 40 may be metal-oxide-semiconductor field-effect transistors (MOSFETs) made of a semiconductor material mainly containing silicon carbide (SiC). The semiconductor elements 40 are not limited to MOSFETs and may alternatively be field-effect transistors, such as metal-insulator-semiconductor field-effect transistors (MISFETs), or bipolar transistors, such as insulated gate bipolar transistors (IGBTs). The semiconductor device A10 is described as having n-type channel MOSFETs as the semiconductor elements 40.

As shown in FIG. 5, each semiconductor element 40 has an element obverse surface 40A, an element reverse surface 40B, an obverse-surface electrode 41, a reverse-surface electrode 42 and a gate electrode (not shown). The element obverse surface 40A and the element reverse surface 40B face opposite from each other in the thickness direction z. The obverse surface 40A faces the same side as the obverse surface 20A of the conductive substrate 20 in the thickness direction z. The element reverse surface 40B thus faces the obverse surface 20A.

As shown in FIG. 5, the obverse-surface electrode 41 is disposed on the element obverse surface 40A. The obverse-surface electrode 41 passes the source current that flows out from the semiconductor element 40. The reverse-surface electrode 42 is disposed on the element reverse surface 40B. The reverse-surface electrode 42 passes the drain electrode that flows into the semiconductor element 40. The reverse-surface electrode 42 is electrically bonded to the obverse surface 20A of the conductive substrate 20 via the electrically conductive bonding layer 29. The bonding layer 29 may be made of lead-free solder containing tin (Sn) as a main component or of fired silver. The gate electrode (not shown) is disposed on the element obverse surface 40A. The gate voltage for driving the semiconductor element 40 is applied to the gate electrode.

The plurality of semiconductor elements 40 include a plurality of first elements 401 and a plurality of second elements 402. As shown in FIGS. 1, 2 and 4, the first elements 401 are electrically bonded to the obverse surface 20A of the first conductive segment 201. The first elements 401 are arranged at predetermined intervals in the first direction x. The first elements 401 form an upper arm circuit of the semiconductor device A10.

As shown in FIGS. 1 to 4, the second elements 402 are electrically bonded to the obverse surface 20A of the second conductive segment 202. The second elements 402 are arranged at predetermined intervals in the first direction x. The second elements 402 form a lower arm circuit of the semiconductor device A10.

As shown in FIG. 2, the first elements 401 and the second elements 402 on the conductive substrate 20 are disposed in a staggered arrangement. The semiconductor device A10 of this example includes three first elements 401 and three second elements 402. However, the numbers of the first elements 401 and the second elements 402 included in the semiconductor device A10 are not specifically limited and appropriately adjusted depending on the required characteristics.

Although not shown in the figures, wires, for example, are connected to the obverse-surface electrode 41 of each first element 401 and the first wiring layer 251 of the second conductive segment 202. The wires electrically connect the obverse-surface electrodes 41 of the first elements 401 to the second conductive segment 202. That is, the first output terminal 33 is electrically connected to the obverse-surface electrodes 41 of the first elements 401 via the second conductive segment 202 and the wires. The first output terminal 33 therefore serves as the source terminal of the first elements 401.

The reverse-surface electrode 42 of each first element 401 is electrically connected to the first wiring layer 251 of the first conductive segment 201 via the corresponding bonding layer 29. That is, the first input terminal 31 is electrically connected to the reverse-surface electrodes 42 of the first elements 401 via the first conductive segment 201. The first input terminal 31 therefore serves as the drain terminal of the first elements 401.

Although not shown in the figures, wires, for example, are connected to the obverse-surface electrode 41 of each second element 402 and the first wiring layer 251 of the third conductive segment 203. The wires electrically connect the obverse-surface electrodes 41 of the second elements 402 to the third conductive segment 203. That is, the second input terminal 32 is electrically connected to the obverse-surface electrodes 41 of the second elements 402 via the third conductive segment 203 and the wires. The second input terminal 32 therefore serves as the source terminal of the second elements 402.

The reverse-surface electrode 42 of each second element 402 is electrically connected to the first wiring layer 251 of the second conductive segment 202 via the corresponding bonding layer 29. With this configuration, the second output terminal 34 is electrically connected to the reverse-surface electrodes 42 of the second elements 402 via the second conductive segment 202 and the wires. The second output terminal 34 therefore serves as the drain terminal of the second elements 402.

The semiconductor device A10 additionally includes gate wires and sensor wires although they are not shown in the figures. The gate wires are provided for each of the first elements 401 and the second elements 402. The gate wires provided for the first elements 401 connect the gate electrodes (not shown) of the first elements 401 to the gate wiring layer 271 that is located on the first conductive segment 201. The gate wires provided for the second elements 402 connect the gate electrodes (not shown) of the second elements 402 to the gate wiring layer 271 that is located on the second conductive segment 202. The gate terminals 35, which are connected to the corresponding gate wiring layers 271, are used, one for driving the first elements 401 and the other for driving the second elements 402.

The sensor wires are provided for each of the first elements 401 and the second elements 402. The sensor wires provided for the first elements 401 connect the obverse-surface electrodes 41 of the first elements 401 to the sensor wiring layer 272 located on the first conductive segment 201. The sensor wires provided for the second elements 402 connect the obverse-surface electrodes 41 of the second elements 402 to the sensor wiring layer 272 located on the second conductive segment 202. Each sensor terminal 36 is connected to one of the two sensor wiring layers 272, and via such sensor terminal 36, voltage (corresponding to the source current) is applied to the obverse-surface electrodes 41 of the first elements 401 or the second elements 402.

As shown in FIGS. 2 to 4, the sealing resin 60 covers the support substrate 10, part of each of the first input terminal 31, the second input terminal 32, the first output terminal 33 and the second output terminal 34, and also covers the conductive substrate 20 and the semiconductor elements 40. The sealing resin 60 also covers the pair of insulating layers 26, the pair of gate wiring layers 271, the pair of sensor wiring layers 272 and the above-described wires. The sealing resin 60 also covers part of each of the pair of gate terminals 35 and part of each of the pair of sensor terminals 36. The sealing resin 60 is made of a black epoxy resin, for example.

As shown in FIGS. 3 and 4, the sealing resin 60 has a top surface 61 and a bottom surface 62. The top surface 61 faces the same side as the supporting surface 10A of the support substrate 10 in the thickness direction z. The bottom surface 62 faces opposite from the top surface 61 in the thickness direction z. The bottom surface 10B of the bottom plate 13 (the support substrate 10) is exposed on the bottom surface 62. The bottom surface 62 surrounds the bottom plate 13 like a frame. The portions of the gate terminals 35 and the sensor terminals 36 exposed from the sealing resin 60 are bent as required by the intended use of the semiconductor device A10.

Next, advantages of the semiconductor device A10 are described.

The semiconductor device A10 includes the conductive substrate 20 containing graphite. Specifically, the conductive substrate 20 includes the first base layer 211 and the second base layer 212 each of which is made of graphite, and the metal layer 22 is disposed between the first base layer 211 and the second base layer 212. The semiconductor elements 40 are bonded to the obverse surface 20A of the conductive substrate 20. For the graphite of the first base layer 211, the stacking direction of the graphene sheets 211A (the first stacking direction N1) is perpendicular to the thickness direction z. That is, the graphene sheets 211A forming the first base layer 211 has the in-plane direction parallel to the thickness direction z. Also, for the graphite of the second base layer 212, the stacking direction of the graphene sheets 212A (the second stacking direction N2) is perpendicular to the thickness direction z and intersects the first stacking direction N1 of the graphene sheets 211A. That is, the graphene sheets 212A forming the second base layer 212 has the in-plane direction that is parallel to the thickness direction z and intersects the in-plane direction of the graphene sheets 211A of the first base layer 211.

As stated above, graphite has a thermal conductivity of about 1500 W/(m·K) in the in-plane direction of graphene sheets, and this is nearly four times the thermal conductivity of copper (398 W/(m·K)). Thus, the first base layer 211 and the second base layer 212 exhibit high thermal conductivity in their in-plane directions of graphene sheets 211A and 212A, and their in-plane directions are arranged to be parallel to the thickness direction z and intersect with each other. This configuration ensures that heat generated by the semiconductor elements 40 is effectively distributed three-dimensionally via the first base layer 211 and the second base layer 212 and also via the metal layer 22 disposed between the base layers. The semiconductor device A10 is therefore configured to have improved heat dissipation.

In the semiconductor device A10, the stacking direction of the graphene sheets 212A forming the second base layer 212 (the second stacking direction N2) is perpendicular to the thickness direction z and also to the stacking direction of the graphene sheets 211A forming the first base layer 211 (the first stacking direction N1). That is, the in-plane directions of the graphene sheets 211A and 212A respectively of the first base layer 211 and the second base layer 212 are parallel to the thickness direction z and perpendicular to each other. This configuration ensures that heat generated by the semiconductor elements 40 is distributed by the first base layer 211 and the second base layer 212 isotopically in three-dimensional directions (in the xyz coordinate system). This is favorable for the semiconductor device A10 to have improved heat dissipation.

The metal layer 22 includes the first metal part 23 (the second layer 232) and the second metal part 24 (the second layer 242) that are joined together by solid-state diffusion bonding. Joining the first base layer 211 and the second base layer 212 by solid-state diffusion bonding ensures that transfer of heat is not limited across the layers of the metal layer 22 in the thickness direction z. The semiconductor device A10 is therefore configured to have improved heat dissipation.

The semiconductor device A10 includes the plurality of semiconductor elements 40 (the first elements 401 and the second elements 402). The first elements 401 are spaced apart at predetermined intervals and electrically connected in parallel. The second elements 402 are spaced apart at predetermined intervals and electrically connected in parallel. This means that heat is generated simultaneously by the first elements 401 or the second elements 402, so that the amount of heat tends to be large. To address this issue of heat generated by the semiconductor elements 40, the semiconductor device A10 is provided with the first base layer 211 and the second base layer 212 capable of distributing heat isotopically in three-dimensional directions (in the xyz coordinate system) as described above. Consequently, heat generated by the semiconductor elements 40 is distributed quickly and widely in the conductive substrate 20, reducing heat locally confined in the conductive substrate 20.

Figure 12:
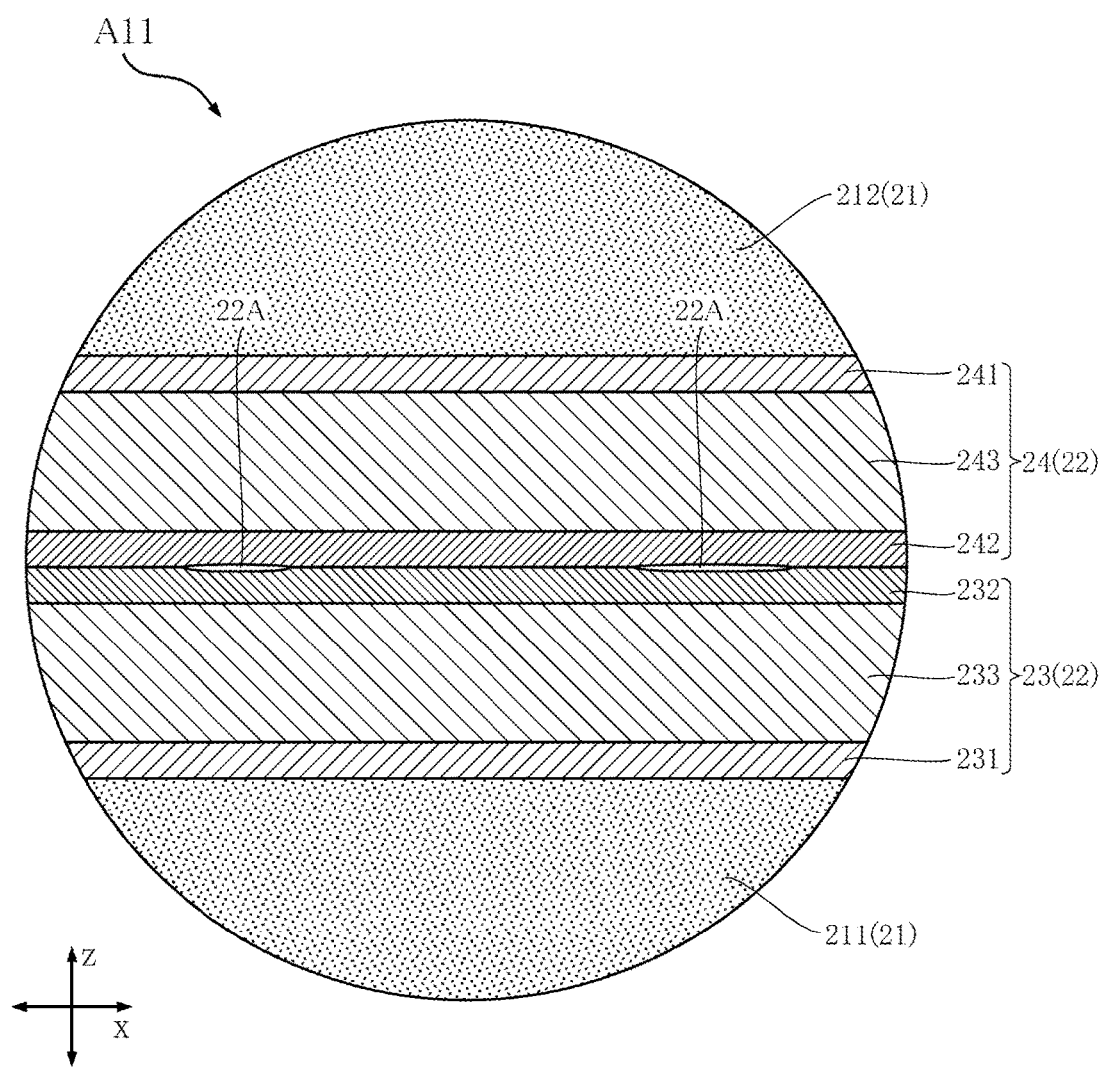
FIG. 12 is an enlarged sectional view showing a part of a semiconductor device according to a variation of the first embodiment of the present disclosure.

With reference to FIG. 12, the following describes a semiconductor device A11 that is a variation of the semiconductor device A10. The semiconductor device A11 include a first metal part 23 and a second metal part 24 of different configuration from those of the semiconductor device A10 described above.

As shown in FIG. 12, the first metal part 23 of the semiconductor device A11 additionally includes a third layer 233 between the first layer 231 and the second layer 232. The third layer 233 is made of aluminium (Al), for example. The third layer 233 has a Young's modulus of 70.3 GPa (provided that the third layer 233 is made of aluminium). As compared with the Young's moduli of the first layer 231 and the second layer 232 mentioned above, the third layer 233 has a lower Young's modulus than the first layer 231 and the second layer 232. In addition, the third layer 233 has a thickness of about 10 to 100 μm, which is greater than the thicknesses of the first layer 231 and the second layer 232. The third layer 233 may be formed by sputtering or vacuum deposition.

The second metal part 24 of the semiconductor device A11 additionally includes a third layer 243 between the first layer 241 and the second layer 242. The third layer 243 is made of a material containing aluminium (Al), for example. Consequently, the third layer 243 has a lower Young's modulus than the first layer 241 and the second layer 242. In addition, the third layer 243 has a thickness of about 10 to 100 μm, which is greater than the thicknesses of the first layer 241 and the second layer 242. The third layer 243 may be formed by sputtering or vacuum deposition.

As described above, the third layers 233 and 243 of the semiconductor device A11 have a lower Young's modulus than the first layers 231 and 241 and the second layers 232 and 242. The third layers 233 and 243 can therefore serve to reduce the stress applied to the first metal part 23 and the second metal part 24 upon joining the second layer 232 of the first metal part 23 and the second layer 242 of the second metal part 24 by solid-state diffusion bonding. Consequently, the residual stress in the first metal part 23 and the second metal part 24 resulting from joining by solid-state diffusion bonding is reduced. The first metal part 23 and the second metal part 24 are therefore less prone to cracking during operation of the semiconductor device A11. The configuration of the first metal part 23 and the second metal part 24 of this variation may be employed in any of semiconductor devices A13, A20 and A21, which will be described later.

Figure 13:
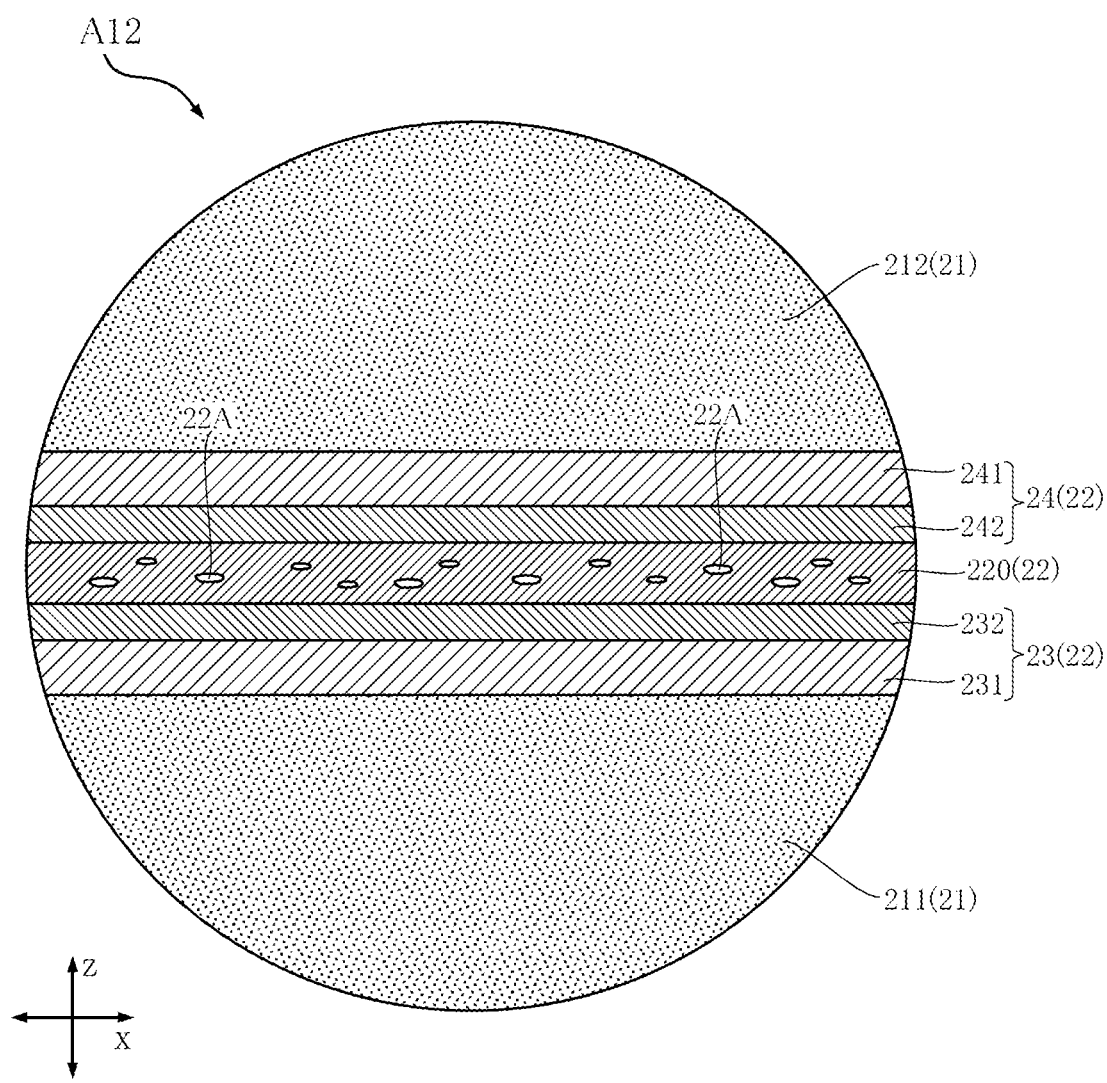
FIG. 13 is an enlarged sectional view showing a part of a semiconductor device according to another variation of the first embodiment of the present disclosure.

With reference to FIG. 13, the following describes a semiconductor device A12 that is another variation of the semiconductor device A10. The semiconductor device A12 has a metal layer 22 of a different configuration from the semiconductor device A10.

As shown in FIG. 13, the metal layer 22 of the semiconductor device A12 includes a first metal part 23, a second metal part 24 and a fired metal layer 220. The fired metal layer 220 is disposed between the first metal part 23 and the second metal part 24. As to the construction materials, the first layer 231 and the second layer 232 of the first metal part 23 and also the first layer 241 and the second layer 242 of the second metal part 24 are the same as those of the semiconductor device A10. The difference lies in that the first metal part 23 (the second layer 232) and the second metal part 24 (the second layer 242) are joined together via the fired metal layer 220. The fired metal layer 220 is made of a material containing copper or a copper alloy, for example. The material of the fired metal layer 220 may contain silver.

The fired metal layer 220 bonding the first metal part 23 (the second layer 232) and the second metal part 24 (the second layer 242) is formed by applying a metal paste of an appropriate material between the first metal part 23 and the second metal part 24, followed by firing. The firing is carried out under pressure at high temperatures to produce the bond.

As shown in FIG. 13, the fired metal layer 220 has voids 22A. The voids 22A are formed at the time of firing the fired metal layer 220 for bonding.

The semiconductor device A12 includes the conductive substrate 20 containing graphite. Specifically, the conductive substrate 20 includes the first base layer 211 and the second base layer 212 each of which is made of graphite, and also includes the metal layer 22 disposed between the first base layer 211 and the second base layer 212. The configuration of the first base layer 211 and the second base layer 212 are the same as those of the semiconductor device A10 described above. The semiconductor device A12 is therefore provided with improved heat dissipation in a similar manner to the semiconductor device A10.

In the semiconductor device A12, the metal layer 22 includes the fired metal layer 220 joining the first metal part 23 (the second layer 232) and the second metal part 24 (the second layer 242). Joining the first base layer 211 and the second base layer 212 via the fired metal layer 220 ensures that transfer of heat is not limited across the layers of the metal layer 22 in the thickness direction z. The semiconductor device A12 is therefore configured to have improved heat dissipation. The configuration of the metal layer 22 of this variation may be employed in any of the semiconductor devices A13, A20 and A21, which will be described later.

Figure 14:
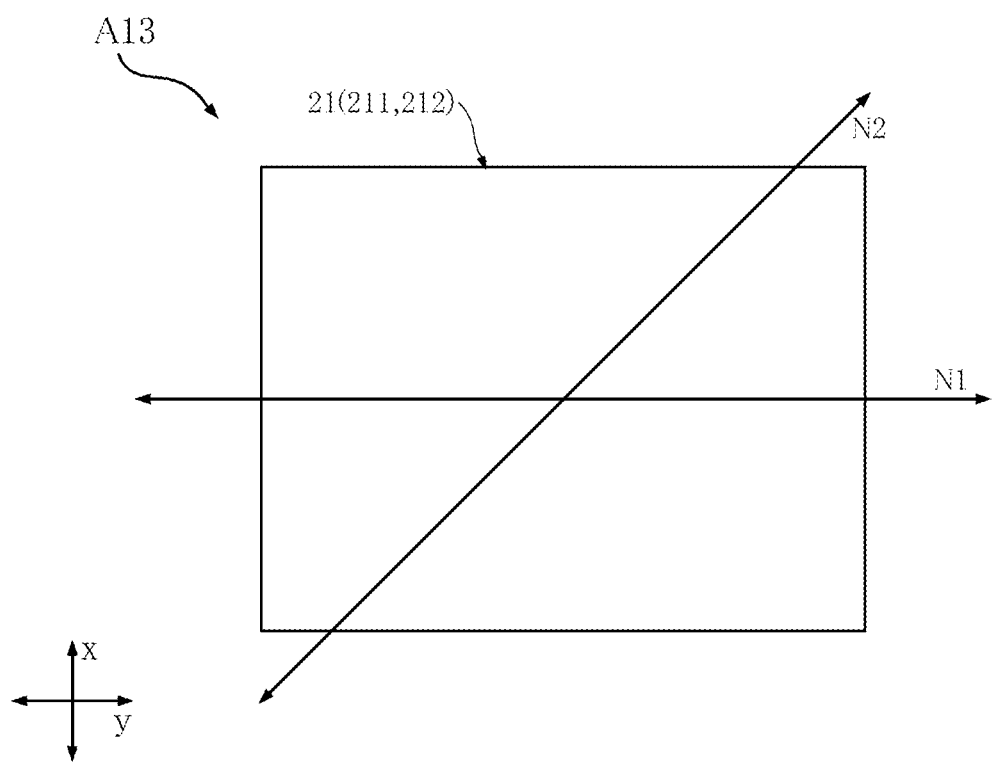
FIG. 14 is a view of a semiconductor device according to a yet another variation of the first embodiment, illustrating the relation between a first stacking direction and a second stacking direction as viewed in the thickness direction of the conductive substrate.

With reference to FIG. 14, the following describes the semiconductor device A13 that is a yet another variation of the semiconductor device A10. The semiconductor device A13 has the base portion 21 (the conductive substrate 20) that includes a first base layer 211 and a second base layer 212 of different configurators from those of the semiconductor device A10 described earlier.

In the semiconductor device A13, the stacking direction of graphene sheets 211A forming the first base layer 211 (the first stacking direction N1), as well as the stacking direction of graphene sheets 212A forming the second base layer 212 (the second stacking direction N2), is perpendicular to the thickness direction z. As shown in FIG. 14, in addition, the first stacking direction N1 of the first base layer 211 and the second stacking direction N2 of the second base layer 212 intersect with each other. However, the angle of intersection is not a right angle (a non-right angle) as viewed in the thickness direction z. In the example shown in FIG. 14, the first stacking direction N1 of the first base layer 211 and the second stacking direction N2 of the second base layer 212 intersect at 45° as viewed in the thickness direction z. In another example, the angle formed by the first stacking direction N1 and the second stacking direction N2 can be adjusted as desired, on condition that the first stacking direction N1 and the second stacking direction N2 are not parallel to each other as viewed in the thickness direction z (on condition that the first stacking direction N1 and the second stacking direction N2 are different from each other).

With this configuration of the semiconductor device A13, heat generated by the semiconductor elements 40 is effectively distributed three-dimensionally via the first base layer 211, the metal layer 22 and the second base layer 212. The semiconductor device A13 is therefore configured to have improved heat dissipation.

Figure 15:
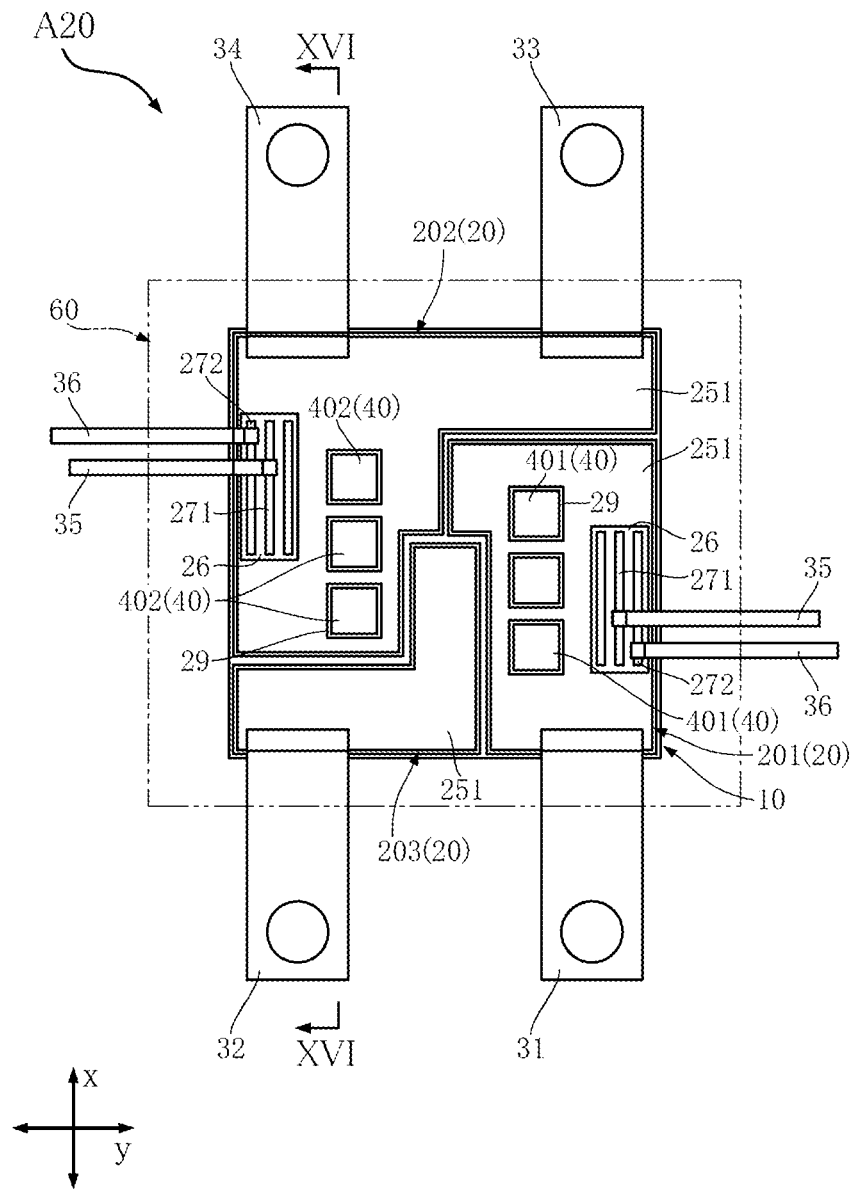
FIG. 15 is a plan view of a semiconductor device (as seen through a sealing resin) according to a second embodiment of the present disclosure.
Figure 16:
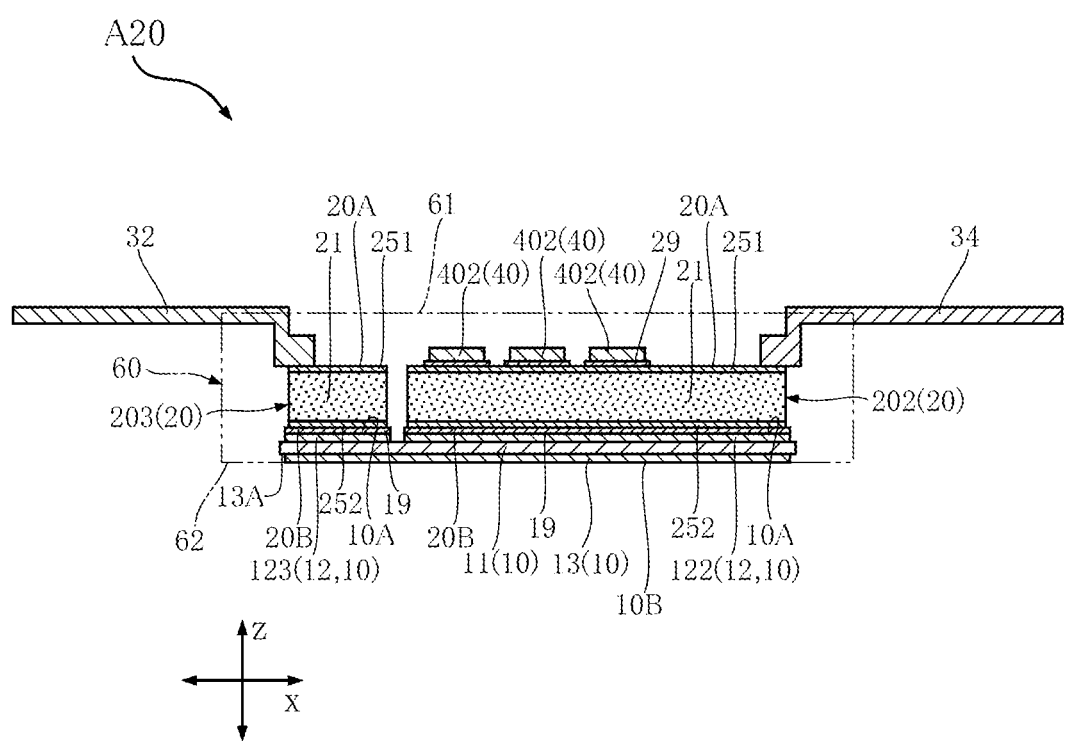
FIG. 16 is a sectional view taken along line XVI-XVI of FIG. 15.
Figure 17:
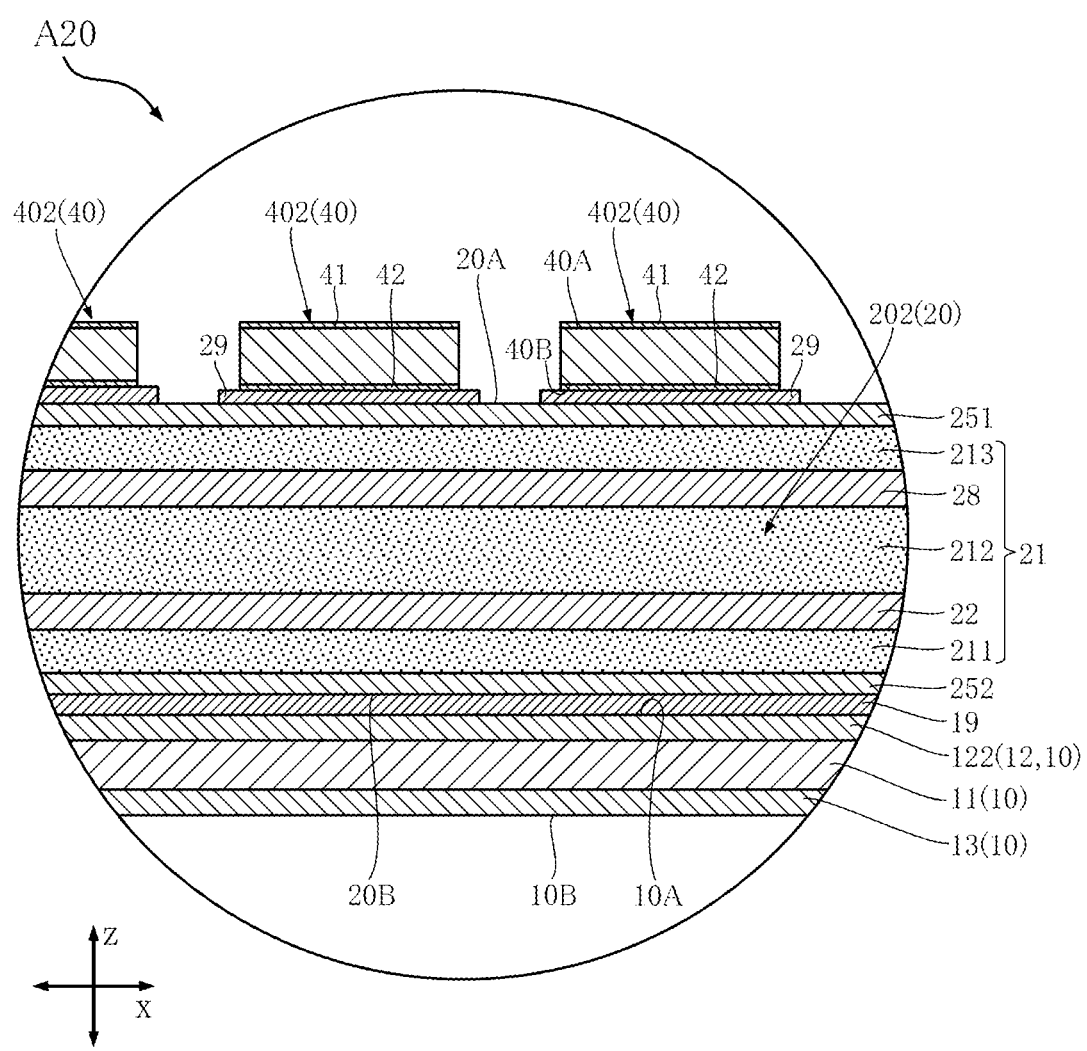
FIG. 17 is an enlarged view showing a part of FIG. 16.

With reference to FIGS. 15 to 17, the semiconductor device A20 according to a second embodiment of the present disclosure will be described. In these figures, components that are the same as or similar to those of the semiconductor device A10 described above are denoted by the same reference signs, and a description of such a component will not be repeated. For convenience, FIGS. 15 to 17 show the sealing resin 60 as transparent. In FIGS. 15 and 16, the sealing resin 60 is shown in phantom (dash-double dot lines).

The semiconductor device A20 differs from the semiconductor device A10 described earlier in the configuration of a base portion 21 included in the conductive substrate 20.

As shown in FIG. 17, the base portion 21 in the semiconductor device A20 includes the first base layer 211, the second base layer 212, a third base layer 213, the metal layer 22 and a metal layer 28. In terms of volume, the first base layer 211, the second base layer 212 and the third base layer 213 make up the majority of the conductive substrate 20.

The base portion 21 of the semiconductor device A20 includes the third base layer 213 and the metal layer 28, which are not included in the base portion 21 of the semiconductor device A10. The third base layer 213 is disposed at the opposite side of the second base layer 212 from the first base layer 211. Similarly to the first base layer 211 and the second base layer 212, the third base layer 213 is composed of single-crystal graphite.

Figure 18:
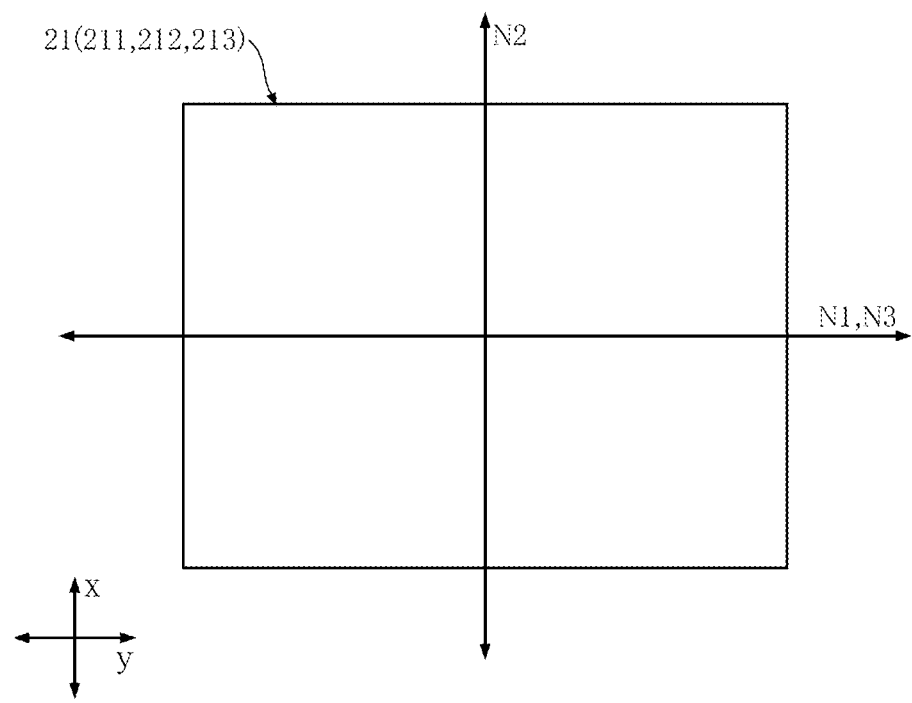
FIG. 18 is a view illustrating the relation between a first stacking direction, a second stacking direction and a third stacking direction as viewed in the thickness direction of the conductive substrate.

As will be understood from FIG. 18, the stacking direction of graphene sheets forming the third base layer 213 (third stacking direction N3) is different from the stacking direction of the graphene sheets 212A forming the second base layer 212 (the second stacking direction N2). In the semiconductor device A20, the stacking direction of graphene sheets forming the third base layer 213 (the third stacking direction N3) may coincide with the stacking direction of the graphene sheets 211A forming the first base layer 211 (the first stacking direction N1). In this case, the first base layer 211 has the xz orientation and the second base layer 212 has the yz orientation as in the embodiment described above, and the third base layer 213 has the xz orientation.

In the semiconductor device A20, the first base layer 211 and the third base layer 213 are thinner than the second base layer 212. In a specific example, the first base layer 211 has a thickness of about 0.5 mm, the second base layer 212 has a thickness of about 1.0 mm, and the third base layer 213 has a thickness of about 0.5 mm. The ratio of the thicknesses of the first base layer 211, the second base layer 212 and the third base layer 213 is preferably about 1:2:1.

The metal layer 28 is disposed between the second base layer 212 and the third base layer 213 to bond the second base layer 212 and the third base layer 213 together. The metal layer 28 has substantially the same configuration as the metal layer 22. Although not clearly shown in the figures, the metal layer 28 includes parts corresponding to the first metal part 23 and the second metal part 24 of the metal layer 22. In the metal layer 28, the part corresponding to the first metal part 23 of the metal layer 22 is formed on the second base layer 212. In the metal layer 28, the part corresponding to the second metal part 24 of the metal layer 22 is formed on the third base layer 213. In the metal layer 28, the part corresponding to the first metal part 23 includes layers corresponding to the first layer 231 and the second layer 232 described above, and the part corresponding to the second metal part 24 includes layers corresponding to the first layer 241 and the second layer 242 described above.

In the metal layer 28, the part corresponding to the first metal part 23 of the metal layer 22 is joined to the part corresponding to the second metal part 24 of the metal layer 22 by solid-state diffusion bonding. Similarly to the metal layer 22, the metal layer 28 formed by solid-state diffusion bonding has voids (not shown).

In the semiconductor device A20, the first wiring layer 251 is stacked on the third base layer 213.

Next, advantages of the semiconductor device A20 are described.

The semiconductor device A20 includes the conductive substrate 20 containing graphite. The conductive substrate 20 includes the first base layer 211, the second base layer 212 and the third base layer 213 which are made of graphite, and the base layers are stacked via the metal layer 22 and the metal layer 28 in between. The stacking direction of the graphene sheets forming the third base layer 213 (the third stacking direction N3) is different from the stacking direction of the graphene sheets 212A forming the second base layer 212 (the second stacking direction N2). With this configuration of the semiconductor device A20, heat generated by the semiconductor elements 40 is effectively distributed three-dimensionally via the first base layer 211, the second base layer 212 and the third base layer 213 and also via the metal layers 22 and 28 stacked between the base layers. The semiconductor device A20 is therefore configured to have improved heat dissipation.

In the semiconductor device A20, the stacking direction of the graphene sheets 212A forming the second base layer 212 (the second stacking direction N2) is perpendicular to the thickness direction z and also to the stacking direction of the graphene sheets 211A forming the first base layer 211 (the first stacking direction N1). That is, the first base layer 211 has the xz orientation, and the second base layer 212 has the yz orientation. The third base layer 213 has the same stacking direction of the graphene sheets (the third stacking direction N3) as the stacking direction of the graphene sheets 211A forming the first base layer 211 (the first stacking direction N1). Hence, the third base layer 213 has the same xz orientation like the first base layer 211. With this configuration, heat generated by the semiconductor elements 40 is distributed isotopically in three-dimensional directions (in the xyz coordinate system) via the first base layer 211, the second base layer 212 and the third base layer 213.

In the semiconductor device A20, the metal layer 22 disposed between the first base layer 211 and the second base layer 212 is joined by solid-state diffusion bonding, and so is the metal layer 28 disposed between the second base layer 212 and the third base layer 213. This configuration ensures that transfer of heat is not limited across the first base layer 211, the second base layer 212 and the third base layer 213 in the thickness direction z. The semiconductor device A20 is therefore configured to have improved heat dissipation.

The semiconductor device A20 includes the plurality of semiconductor elements 40 (the first elements 401 and the second elements 402). The first elements 401 are spaced apart at predetermined intervals and electrically connected in parallel. The second elements 402 are spaced apart at predetermined intervals and electrically connected in parallel. This means that heat is generated simultaneously by the first elements 401 or the second elements 402, so that the amount of heat tends to be large. To address this issue of heat generated by the semiconductor elements 40, the semiconductor device A20 is provided with the first base layer 211, the second base layer 212 and the third base layer 213 capable of distributing isotopically in three-dimensional directions (in the xyz coordinate system). Consequently, heat generated by the semiconductor elements 40 is distributed quickly and widely in the conductive substrate 20, reducing heat locally confined in the conductive substrate 20.

As described above, the first base layer 211, the second base layer 212 and the third base layer 213 is made of graphite, which has anisotropic thermal conductivity and hence has anisotropic thermal expansion. In the semiconductor device A20, the first base layer 211 and the third base layer 213 have the same orientation (the same stacking direction of graphene sheets), and the second base layer 212 is disposed between them. In addition, the first base layer 211 and the third base layer 213 are thinner than the second base layer 212. The conductive substrate 20 (the first base layer 211, the second base layer 212 and the third base layer 213) of this configuration is less susceptible to undesirable deformation due to heat generated by the semiconductor elements 40.

Figure 19:
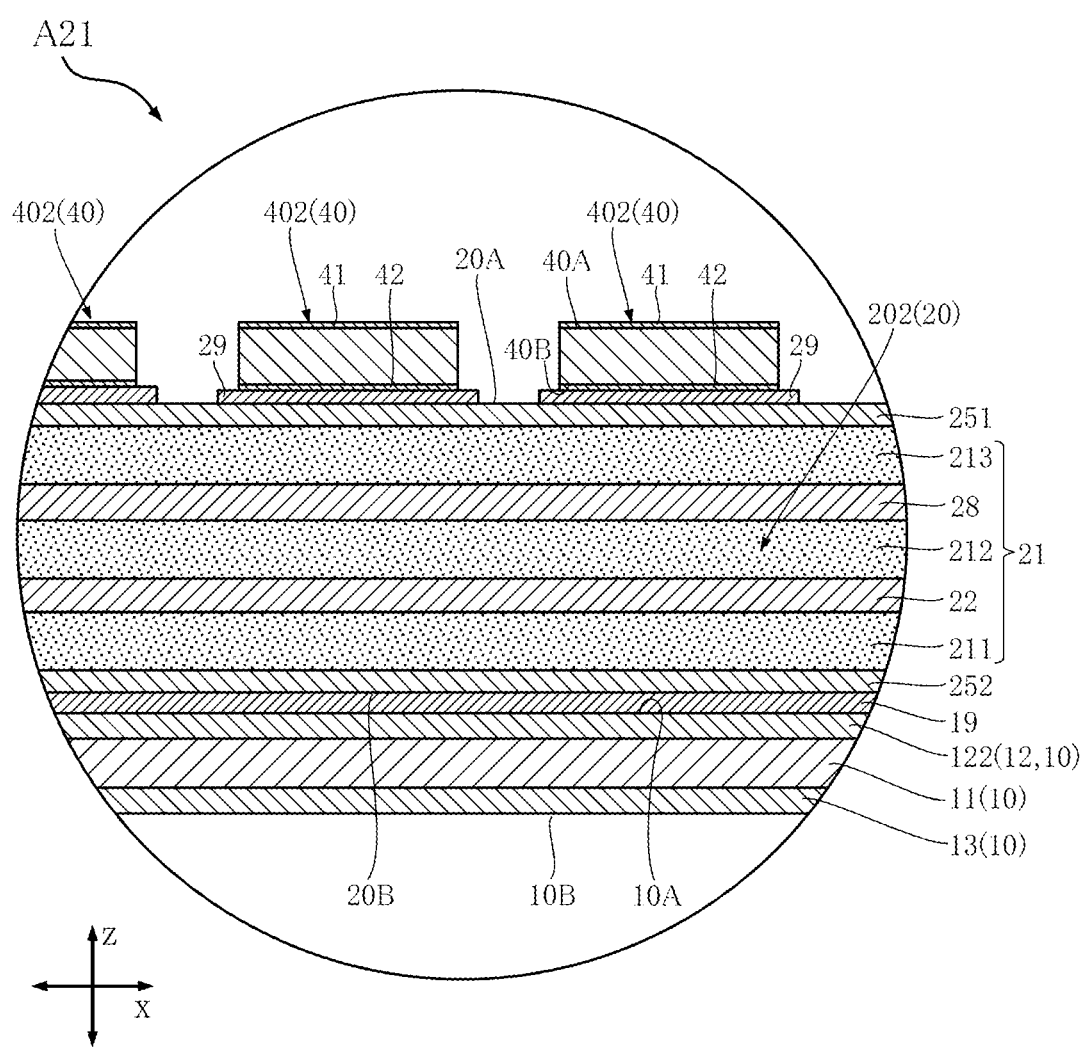
FIG. 19 is an enlarged sectional view showing a part of a semiconductor device according to a variation of the second embodiment of the present disclosure.
Figure 20:
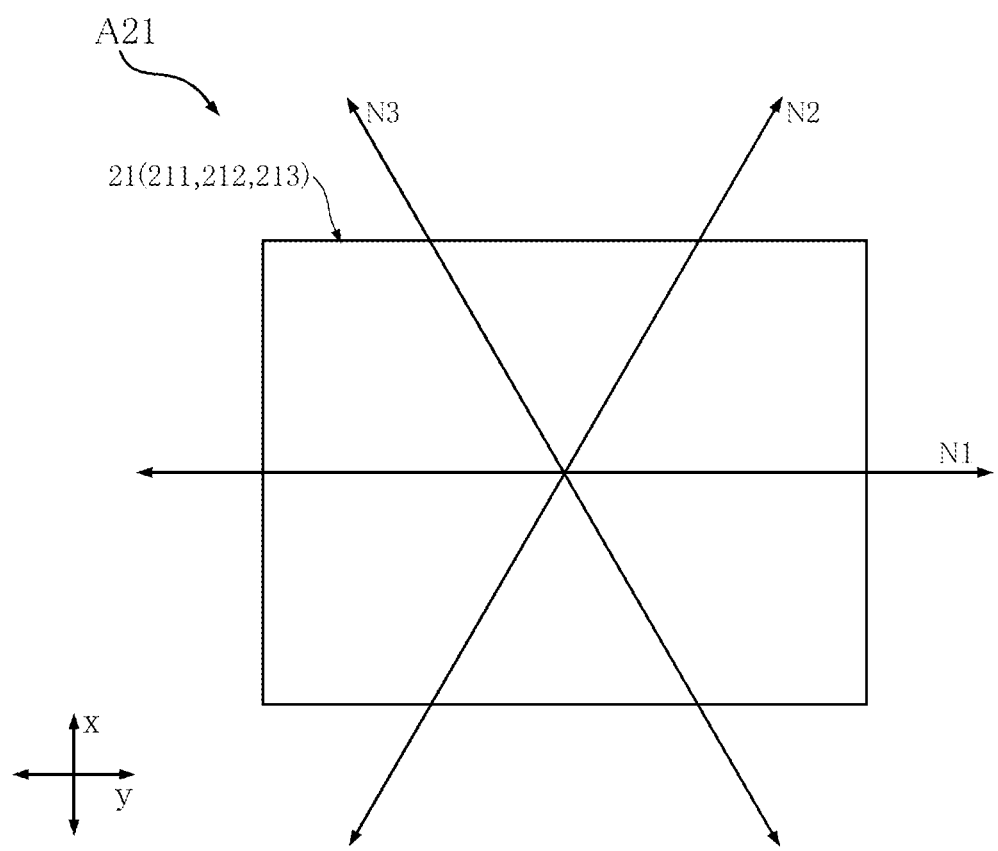
FIG. 20 is a view illustrating the relation between a first stacking direction, a second stacking direction and a third stacking direction as viewed in the thickness direction of the conductive substrate.

With reference to FIGS. 19 and 20, the following describes the semiconductor device A21 that is a variation of the semiconductor device A20. The semiconductor device A21 has the base portion 21 (the conductive substrate 20) that includes a first base layer 211, a second base layer 212 and a third base layer 213 of different configurators from those of the semiconductor device A20 described above.

As shown in FIG. 19, the first base layer 211, the second base layer 212 and the third base layer 213 of the semiconductor device A21 have substantially the same thickness.

As shown in FIG. 20, in the semiconductor device A21, the stacking direction of the graphene sheets 211A forming the first base layer 211 (the first stacking direction N1), the stacking direction of the graphene sheets 212A forming the second base layer 212 (the second stacking direction N2), and the stacking direction of the graphene sheets forming the third base layer 213 (the third stacking direction N3) are perpendicular to the thickness direction z. As viewed in the thickness direction z, the first stacking direction N1 of the first base layer 211, the second stacking direction N2 of the second base layer 212 and the third stacking direction N3 of the third base layer 213 intersect with each other. However, the angle of intersection between the layers is not at a right angle (a non-right angle). In the semiconductor device A21, the first stacking direction N1, the second stacking direction N2 and the third stacking direction N3 are offset from each other by an angle of 60°.

With this configuration of the semiconductor device A21, heat generated by the semiconductor elements 40 is effectively distributed three-dimensionally via the first base layer 211, the second base layer 212 and the third base layer 213 and also via the metal layers 22 and 28 stacked between the base layers. The semiconductor device A21 is therefore configured to have improved heat dissipation.

In the semiconductor device A21, the first base layer 211, the second base layer 212 and the third base layer 213 have substantially the same thickness. In addition, the first stacking direction N1, the second stacking direction N2 and the third stacking direction N3 as viewed in the thickness direction z are offset from each other at equal angels. This configuration ensures that heat generated by the semiconductor elements 40 is distributed by the first base layer 211, the second base layer 212 and the third base layer 213 isotopically in three-dimensional directions (in the xyz coordinate system).

Although FIG. 21 shows the example in which the first stacking direction N1, the second stacking direction N2 and the third stacking direction N3 are offset by 60° as viewed in the thickness direction z, the angular relationship can be adjusted as desired. Also, the thicknesses of the first base layer 211, the second base layer 212 and the third base layer 213 can be adjusted as desired.

Although specific embodiments of the present disclosure have been described above, the present disclosure is not limited to those embodiments and various modifications can be made without departing from the gist of the present invention. The specific configuration of each part of the semiconductor device according to the present disclosure may be varied in design in many ways.

The present disclosure includes configurations according to the following clauses.

Clause 1.

A semiconductor device comprising:
  a conductive substrate having an obverse surface facing one side in a thickness direction and a reverse surface facing an opposite side from the obverse surface; and
  at least one semiconductor element electrically bonded to the obverse surface,
  wherein the conductive substrate includes: a first base layer and a second base layer each of which is made of graphite composed of stacked graphenes; and a metal layer disposed between the first base layer and the second base layer,
  the graphenes of the first base layer are stacked in a first stacking direction perpendicular to the thickness direction, and
  the graphenes of the second base layer are stacked in a second stacking direction perpendicular to the thickness direction and intersecting the first stacking direction.

Clause 2.

The semiconductor device according to Clause 1, wherein the second stacking direction is perpendicular to the thickness direction and the first stacking direction.

Clause 3.

The semiconductor device according to Clause 1 or 2, wherein the metal layer includes a first metal part formed on the first base layer, and a second metal part formed on the second base layer and bonded to the first metal part.

Clause 4.

The semiconductor device according to Clause 3, wherein a void is present between the first metal part and the second metal part.

Clause 5.

The semiconductor device according to Clause 3 or 4, wherein each of the first metal part and the second metal part includes a first layer covering a corresponding one of the first base layer and the second base layer, and a second layer stacked on the first layer, and
  the second layer of the first metal part and the second layer of the second metal part are joined together by solid-state diffusion bonding.

Clause 6.

The semiconductor device according to Clause 5, wherein each of the first metal part and the second metal part includes a third layer disposed between the first layer and the second layer, and the third layer has a lower Young's modulus than the first layer and the second layer.

Clause 7.

The semiconductor device according to Clause 3 or 4, wherein the metal layer includes a fired metal layer that is disposed between the first metal part and the second metal part and that bonds the first metal part and the second metal part.

Clause 8.

The semiconductor device according to any one of Clauses 1 to 7, wherein each of the first base layer and the second base layer has a greater thickness than the metal layer.

Clause 9.

The semiconductor device according to any one of Clauses 1 to 8, wherein the conductive substrate includes a third base layer made of graphite at a side of the second base layer opposite from the first base layer, and an additional metal layer disposed between the second base layer and the third base layer, and the third base layer comprises graphenes stacked in a third stacking direction that is different from the second stacking direction.

Clause 10.

The semiconductor device according to Clause 9, wherein each of the first base layer and the third base layer has a smaller thickness than the second base layer.

Clause 11.

The semiconductor device according to Clause 10, wherein the third stacking direction coincides with the first stacking direction.

Clause 12.

The semiconductor device according to any one of Clauses 1 to 11, further comprising a support substrate having a supporting surface facing the reverse surface of the conductive substrate, wherein the conductive substrate is bonded to the support substrate with the reverse surface facing the supporting surface.

Clause 13.

The semiconductor device according to Clause 12, wherein the support substrate includes a first supporting plate that is electrically insulating, and a second supporting plate made of metal and stacked on the first supporting plate, the second supporting plate forming the supporting surface.

Clause 14.

The semiconductor device according to Clause 12 or 13, wherein the support substrate has a bottom surface facing opposite from the supporting surface, the semiconductor device further comprises a sealing resin covering the conductive substrate, the semiconductor element and a part of the support substrate, and the bottom surface is exposed from the sealing resin.

Clause 15.

The semiconductor device according to any one of Clauses 1 to 14, wherein the conductive substrate includes a first wiring layer forming the obverse surface and a second wiring layer forming the reverse surface, and the semiconductor element is electrically bonded to the obverse surface via an electrically conductive bonding layer.

Clause 16.

The semiconductor device according to any one of Clauses 1 to 15, wherein the at least one semiconductor element comprises a plurality of semiconductor elements spaced apart from each other.

The invention claimed is:

1. A semiconductor device comprising:
a conductive substrate having an obverse surface facing one side in a thickness direction and a reverse surface facing an opposite side from the obverse surface; and
at least one semiconductor element electrically bonded to the obverse surface, wherein the conductive substrate includes:
a first base layer and a second base layer each of which is made of graphite composed of stacked graphenes; and
a metal layer disposed between the first base layer and the second base layer,
the graphenes of the first base layer are stacked in a first stacking direction perpendicular to the thickness direction,
the graphenes of the second base layer are stacked in a second stacking direction perpendicular to the thickness direction and intersecting the first stacking direction,
the metal layer includes:
a first metal part formed on the first base layer, and
a second metal part formed on the second base layer and bonded to the first metal part,
each of the first metal part and the second metal part includes:
a first layer covering a corresponding one of the first base layer and the second base layer, and
a second layer stacked on the first layer, and
the second layer of the first metal part and the second layer of the second metal part are joined together by solid-state diffusion bonding.

2. The semiconductor device according to claim 1, wherein the second stacking direction is perpendicular to the thickness direction and the first stacking direction.

3. A semiconductor device comprising:
a conductive substrate having an obverse surface facing one side in a thickness direction and a reverse surface facing an opposite side from the obverse surface; and
at least one semiconductor element electrically bonded to the obverse surface, wherein the conductive substrate includes:
a first base layer and a second base layer each of which is made of graphite composed of stacked graphenes; and
a metal layer disposed between the first base layer and the second base layer,
the graphenes of the first base layer are stacked in a first stacking direction perpendicular to the thickness direction,
the graphenes of the second base layer are stacked in a second stacking direction perpendicular to the thickness direction and intersecting the first stacking direction,
the metal layer includes:
a first metal part formed on the first base layer, and
a second metal part formed on the second base layer and bonded to the first metal part, and
a void is present between the first metal part and the second metal part.

4. The semiconductor device according to claim 1, wherein
each of the first metal part and the second metal part includes a third layer disposed between the first layer and the second layer, and
the third layer has a lower Young's modulus than the first layer and the second layer.

5. The semiconductor device according to claim 1, wherein the metal layer includes a fired metal layer that is disposed between the first metal part and the second metal part and that bonds the first metal part and the second metal part.

6. The semiconductor device according to claim 1, wherein each of the first base layer and the second base layer has a greater thickness than the metal layer.

7. The semiconductor device according to claim 1, wherein
the conductive substrate includes a third base layer made of graphite at a side of the second base layer opposite from the first base layer, and an additional metal layer disposed between the second base layer and the third base layer, and
the third base layer comprises graphenes stacked in a third stacking direction that is different from the second stacking direction.

8. The semiconductor device according to claim 7, wherein each of the first base layer and the third base layer has a smaller thickness than the second base layer.

9. The semiconductor device according to claim 8, wherein the third stacking direction coincides with the first stacking direction.

10. The semiconductor device according to claim 1, further comprising a support substrate having a supporting surface facing the reverse surface of the conductive substrate,
wherein the conductive substrate is bonded to the support substrate with the reverse surface facing the supporting surface.

11. The semiconductor device according to claim 10, wherein the support substrate includes a first supporting plate that is electrically insulating, and a second supporting plate made of metal and stacked on the first supporting plate, the second supporting plate forming the supporting surface.

12. A semiconductor device comprising:
a conductive substrate having an obverse surface facing one side in a thickness direction and a reverse surface facing an opposite side from the obverse surface;
at least one semiconductor element electrically bonded to the obverse surface, wherein the conductive substrate includes:
a first base layer and a second base layer each of which is made of graphite composed of stacked graphenes; and
a metal layer disposed between the first base layer and the second base layer,
the graphenes of the first base layer are stacked in a first stacking direction perpendicular to the thickness direction,
the graphenes of the second base layer are stacked in a second stacking direction perpendicular to the thickness direction and intersecting the first stacking direction,
a support substrate having a supporting surface facing the reverse surface of the conductive substrate,
the conductive substrate being bonded to the support substrate with the reverse surface facing the supporting surface,
the support substrate having a bottom surface facing opposite from the supporting surface; and
a sealing resin covering the conductive substrate, the semiconductor element and a part of the support substrate, wherein
the bottom surface is exposed from the sealing resin.

13. The semiconductor device according to claim 1, wherein
the conductive substrate includes a first wiring layer forming the obverse surface and a second wiring layer forming the reverse surface, and
the semiconductor element is electrically bonded to the obverse surface via an electrically conductive bonding layer.

14. The semiconductor device according to claim 1, comprising the at least one semiconductor element comprises a plurality of semiconductor elements spaced apart from each other.

* * * * *